(12) United States Patent
Hansen et al.

(10) Patent No.: US 6,624,539 B1
(45) Date of Patent: Sep. 23, 2003

(54) HIGH POWER ULTRASONIC TRANSDUCERS

(75) Inventors: Thomas T. Hansen, Ames, IA (US); Todd Allan Reinders, Ames, IA (US)

(73) Assignee: Edge Technologies, Inc., Ames, IA (US)

( * ) Notice: Subject to any disclaimer, the term of this patent is extended or adjusted under 35 U.S.C. 154(b) by 0 days.

(21) Appl. No.: 09/577,805

(22) Filed: May 24, 2000

Related U.S. Application Data

(63) Continuation-in-part of application No. 08/855,228, filed on May 13, 1997, now abandoned.
(60) Provisional application No. 60/135,667, filed on May 24, 1999.

(51) Int. Cl.[7] .......................... H01L 42/06; H01L 42/12
(52) U.S. Cl. ........................................................ 310/26
(58) Field of Search ............................ 310/26; 166/248, 166/249; 208/107, 108; 204/157.42, 157.62

(56) References Cited

U.S. PATENT DOCUMENTS

| | | | |
|---|---|---|---|
| 2,717,319 A | 9/1955 | Bundy | 310/16 |
| 2,724,666 A | 11/1955 | Myers | 134/1 |

(List continued on next page.)

FOREIGN PATENT DOCUMENTS

| | | | |
|---|---|---|---|
| DE | 4041063 | 6/1992 | A61F/2/46 |

OTHER PUBLICATIONS

"Magnetostrictive Actuators", Edge Technologies, Inc., Etrema Products Division, 4 p., (date unknown).
"Ultrasonic Equipment—High Power Transducer Type, WT 10", Radyne Limited, UE1 Specification Sheet, 2 p., (1969) (month unknown).

Bennett, C.O., et al., *Momentum, Heat, and Mass Transfer*, Second Edition, McGraw–Hill Book Company, 797 p., (1974) (month unknown).

Bird, R.B., et al., *Transport Phenomena*, John Wiley & Sons, Inc., 769 p., (1960) (month unknown).

(List continued on next page.)

*Primary Examiner*—Nestor Ramirez
*Assistant Examiner*—Judson H. Jones
(74) *Attorney, Agent, or Firm*—Schwegman, Lundberg, Woessner & Kluth, P.A.

(57) ABSTRACT

A high power ultrasonic transducer is provided. In one embodiment, the transducer includes means for providing power in excess of three kilowatts. The transducer further includes an active element made from a magnetostrictive material and means for producing an electromagnetic field which extends through at least a portion of the active element. The active element is changeable between a first shape when in the absence of the electromagnetic field and a second shape when in the presence of the electromagnetic field. The transducer also includes means for providing an electrical signal to the means for producing an electromagnetic field and an acoustic element connected to the transducer for channeling ultrasonic energy to perform work. In one embodiment, an ultra-high power transducer is provided comprising a plurality of sub-motors, each containing an active element made from a smart material, wherein the sub-motors operate simultaneously to produce ultrasonic energy. The transducer in this embodiment further includes a cooling system connected to the transducers for cooling each active element, the cooling system utilizing a phase change medium. The transducer further includes a composite master wave-guide connected to the plurality of sub-motors, the master wave-guide reactive to the ultrasonic energy from the sub-motors, wherein the master wave-guide channels the ultrasonic energy to perform work.

69 Claims, 14 Drawing Sheets

U.S. PATENT DOCUMENTS

| | | | |
|---|---|---|---|
| 2,792,674 A | | 5/1957 | Balamuth et al. ............... 51/64 |
| 3,930,173 A | | 12/1975 | Banko .......................... 310/26 |
| 3,990,452 A | | 11/1976 | Murry et al. ................ 128/305 |
| 4,151,435 A | * | 4/1979 | Jandeska et al. ........ 310/154.07 |
| 4,281,987 A | | 8/1981 | Kleesattel ................... 433/103 |
| 4,308,474 A | | 12/1981 | Savage et al. ................. 310/26 |
| 4,337,896 A | * | 7/1982 | Berger et al. ............ 239/102.2 |
| 4,417,578 A | | 11/1983 | Banko .................... 128/303 R |
| 4,425,115 A | * | 1/1984 | Wuchinich ................... 604/22 |
| 4,609,402 A | | 9/1986 | McMasters .............. 75/65 ZM |
| 4,770,704 A | | 9/1988 | Gibson et al. ........... 75/65 ZM |
| 4,815,946 A | | 3/1989 | Cusack ....................... 417/322 |
| 4,818,304 A | | 4/1989 | Verhoeven et al. ......... 148/103 |
| 4,845,450 A | * | 7/1989 | Porzio et al. ................ 335/215 |
| 4,849,034 A | | 7/1989 | Verhoeven et al. ......... 148/100 |
| 5,052,529 A | * | 10/1991 | Sutcliffe et al. ............ 188/380 |
| 5,109,698 A | * | 5/1992 | Owen .......................... 73/632 |
| 5,110,376 A | | 5/1992 | Kobayashi et al. ......... 148/301 |
| 5,184,037 A | | 2/1993 | Kobayashi et al. ........... 310/26 |
| 5,406,153 A | | 4/1995 | Flatau et al. .................. 310/26 |
| 5,491,559 A | | 2/1996 | Buechler .................... 358/299 |
| 5,560,362 A | | 10/1996 | Sliwa, Jr. et al. ....... 128/660.03 |
| 5,560,543 A | * | 10/1996 | Smith et al. ............. 239/102.2 |
| 5,719,339 A | * | 2/1998 | Hartman et al. .............. 73/811 |
| 5,727,628 A | * | 3/1998 | Patzer ........................ 166/249 |
| 5,731,643 A | * | 3/1998 | Avakian et al. ............... 310/53 |
| 5,812,711 A | * | 9/1998 | Glass et al. .................... 385/37 |
| 5,824,214 A | * | 10/1998 | Paul et al. ................... 208/107 |
| 5,849,242 A | * | 12/1998 | Rusanova et al. .......... 264/625 |
| 5,859,482 A | | 1/1999 | Crowell et al. ................ 310/58 |
| 5,982,054 A | * | 11/1999 | Rathore et al. ................ 310/26 |
| 5,994,818 A | * | 11/1999 | Abramov et al. ........... 310/325 |
| 6,037,682 A | * | 3/2000 | Shoop et al. .................. 310/26 |
| 6,112,541 A | * | 9/2000 | Greene ........................ 62/389 |
| 6,222,289 B1 | * | 4/2001 | Adames ....................... 310/54 |
| 6,230,799 B1 | * | 5/2001 | Slaughter et al. ........... 166/249 |

OTHER PUBLICATIONS

Claeyssen, F., "Design of Lanthanide Magnetostrictive Sonar Projectors", *UDT Conference Proceedings, Undersea Defence Technologies*, pp. 1059–1065, (Apr. 1991).

Crawford, A.E., *Ultrasonic Engineering with particular reference to High Power Applications*, Butterworths Scientific Publications, London, pp. 106–107, (1955) (month unknown).

Croft, L.K., "Ultrasonics in Peridontal Therapy—The Paradigm Has Changed", *Texas Dental Journal*, pp. 7–12, (Apr. 1995).

Lemons, R.S., et al., "Thermal Accomodation Coefficients by High Speed Vibration of Solid Samples", *Surface Science, 48*, pp. 432–448, (1975) (month unknown).

* cited by examiner

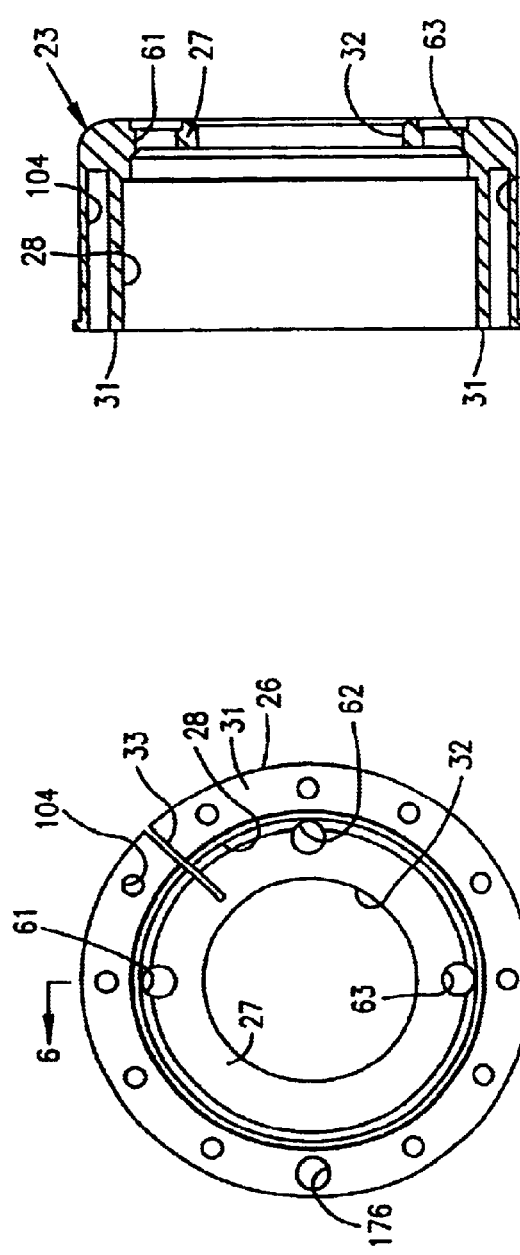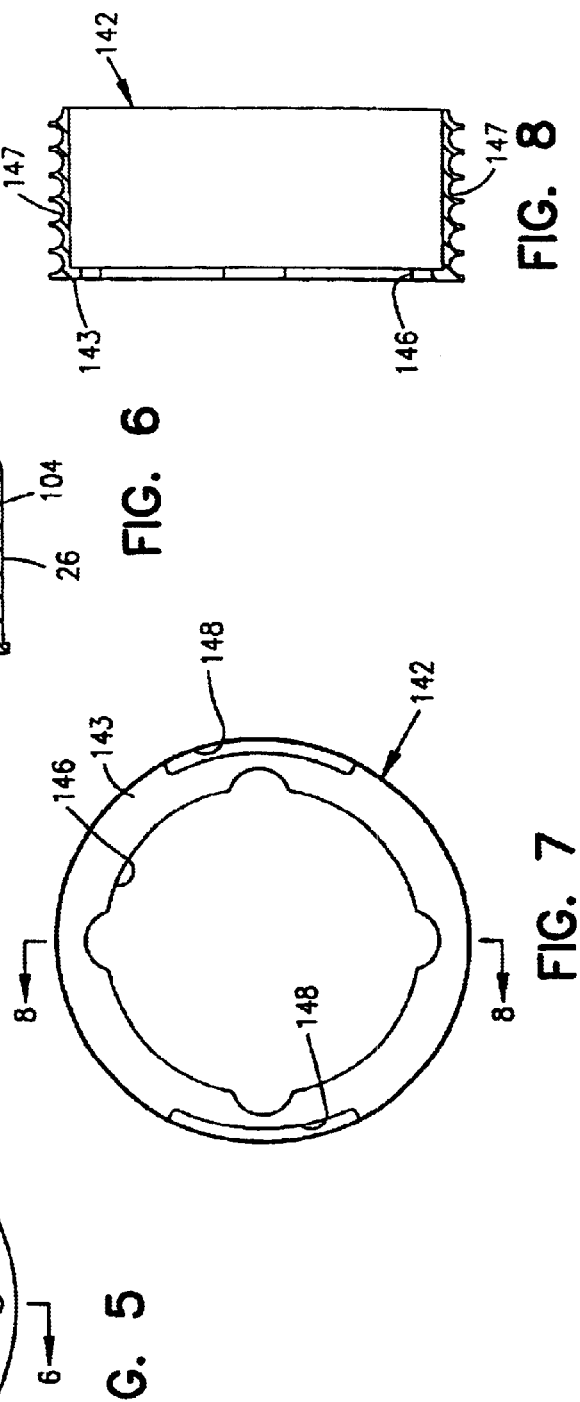

HIGH POWER ULTRASONIC TRANSDUCERS

CROSS-REFERENCE TO RELATED APPLICATIONS

This application is a continuation-in-part of U.S. patent application Ser. No. 08/855,228 filed on May 13, 1997, now pending, hereby incorporated by reference. This application also claims the benefit under 35 U.S.C. 119 (e) of U.S. Provisional Application Ser. No. 60/135,667 filed on May 24, 1999, hereby incorporated by reference.

STATEMENT OF GOVERNMENT RIGHTS

This invention was made with United States Government support under National Institute of Science and Technology (NIST) Advanced Technology Program (ATP) Agreement No. 70NANB7H3017. The United States Government has certain rights in the invention.

FIELD

This invention relates generally to transducers, and, in particular, the present invention relates to ultrasonic transducers.

BACKGROUND

Ultrasonic transducers operate at frequencies of about 18 kHz or greater. Ultrasonic technology has been applied in a wide range of fields, from sonochemistry and industrial cleaning to medical tools. The largest limitation of existing technology is the inability to provide a single transducer with sufficient power to allow important laboratory processes to operate successfully. These include processes such as rubber devulcanization, polymer curing, seed sonication, and so forth. Most such units operate at a maximum effective continuous duty cycle of about 2.5 kW to 3 kW.

Conventional transducers contain a single drive rod, made from either a nickel, piezoelectric (PZT) or piezoceramic material. Although nickel is not known to deteriorate under use, conventional nickel units are heavy and bulky. Furthermore, nickel's relatively high Q (low damping) and low power density cause difficulties in achieving high power intensity. Piezoceramics also have a very high Q (narrow bandwidth). Conventional piezoceramic transducers are also subject to fail due to a variety of operating stresses. Furthermore, operating at maximum electrical, mechanical, and/or temperature stress to increase power output, causes accelerated aging, leading to early component failure. Piezoelectric materials are also not considered inherently reliable, and are known to cause failure in conventional devices. Although multiple units could be combined to produce higher-powered devices with these materials, this would result in inefficient transducers that are costly to operate and not practical for most operations.

An additional limitation of current ultrasonic transducers is the minimal target displacement obtainable, although displacement can be altered with additional horns. Conventional horns or wave-guides are typically made from aluminum alloys, titanium, titanium alloys or steel. These materials have a speed of sound of around 5000 meters/second and a relatively large Poisson's ratio of about 0.3 to 0.34. However, these properties tend to cause unwanted vibrations in large transducers, diverting energy away from the desired output. Furthermore, adding horns increases the size of the transducers, making them bulky and difficult to handle.

For the reasons stated above, and for other reasons stated below which will become apparent to those skilled in the art upon reading and understanding the present specification, there is a need in the art for an improved ultrasonic transducer.

SUMMARY

A high power ultrasonic transducer is provided. In one embodiment, the transducer includes means for providing power in excess of three kilowatts. The transducer further includes an active element made from a magnetostrictive material and means for producing an electromagnetic field which extends through at least a portion of the active element. The active element is changeable between a first shape when in the absence of the electromagnetic field and a second shape when in the presence of the electromagnetic field.

The transducer also includes means for providing an electrical signal to the means for producing an electromagnetic field and an acoustic element connected to the transducer for channeling ultrasonic energy to perform work.

In one embodiment, an ultra-high power transducer is provided comprising a plurality of sub-motors, each containing an active element made from a smart material, wherein the sub-motors operate simultaneously to produce ultrasonic energy. The transducer in this embodiment further includes a cooling system connected to the transducers for cooling each active element, the cooling system utilizing a phase change medium. The transducer further includes a composite master wave-guide connected to the plurality of sub-motors, the master wave-guide reactive to the ultrasonic energy from the sub-motors, wherein the master wave-guide channels the ultrasonic energy to perform work.

In one embodiment, the transducer is capable of receiving approximately 30 kW of electrical power and converting it into mechanical ultrasonic power at about 20 kHz. In this embodiment, multiple ½ wavelength drive rods wave-guide sub-motor assemblies are connected to a single ½ wave length high speed of sound master wave-guide to provide a one full wave length device. In one embodiment, each drive rod is made from TERFENOL-D.

The high power and ultra-high power transducers of the present invention can be utilized in a number of sonochemical applications, including, but not limited to, rubber devulcanization, polymer curing, seed sonication, treating waste water and other waste byproducts, removing nitrates from potable water, and so forth. For the first time, ultrasonic power at 100% duty cycle can be achieved for high power operations, i.e., up to 30 kW or more, essentially allowing for a continuous operation seven days a week, 24 hours a day. Current ultrasonic transducers are incapable of operating at the requisite power levels for these commercial applications. Use of the transducers in the present invention can provide broad-based economic benefits to numerous industries. Additional benefits are achieved environmentally as a number of these processes allow for the recycling of various materials.

BRIEF DESCRIPTION OF THE DRAWINGS

FIG. 5 is a sectional view of the ultrasonic transducer of FIG. 1 taken along line 5—5 of FIG. 4 in one embodiment of the present invention.

FIG. 6 is a cross-sectional view of the ultrasonic transducer of FIG. 1 taken along line 6—6 of FIG. 5 in one embodiment of the present invention.

FIG. 7 is a sectional view of the ultrasonic transducer of FIG. 1 taken along line 7—7 of FIG. 4 in one embodiment of the present invention.

FIG. 8 is a cross-sectional view of the ultrasonic transducer of FIG. 1 taken along line 8—8 of FIG. 7 in one embodiment of the present invention.

DETAILED DESCRIPTION

Figure 2:
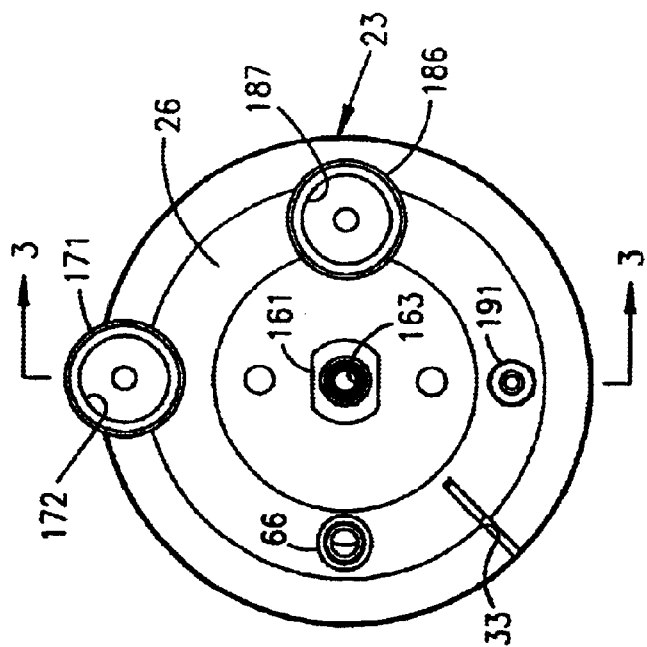
FIG. 2 is an end view of the ultrasonic transducer of FIG. 1 in one embodiment of the present invention.

In the following detailed description, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that mechanical, procedural, electrical and other changes may be made without departing from the spirit and scope of the present inventions. The following detailed description is, therefore, not to be taken in a limiting sense, and the scope of the present invention is defined only by the appended claims, along with the full scope of equivalents to which such claims are entitled.

Although the terms "actuator," "transducer" and "motor" may be used interchangeably herein, a "transducer" as defined herein, is intended to broadly refer to a device that converts a signal from one form of energy to another. Within the field of acoustical engineering specifically, a transducer is a device that converts electrical energy into acoustic energy, and visa versa. ("Acoustics" is generally defined as the energy associated with sound waves, expressed quantitatively by the difference between the total energy of a sound field and the energy that would exist in the same region in the absence of sound). A "motor" in the sense of an "electric motor" is a device that converts electrical energy into mechanical energy using forces exerted by magnetic fields on current-carrying conductors. (Although the term "motor" has historically been used in the industry to describe the type of ultrasonic devices disclosed herein, the term "transducer" has recently become more commonly used to describe such devices). An "actuator" is generally considered to be any device that is moved a predetermined distance to operate or control another mechanical device. Within the field of acoustical engineering, an actuator is considered to be a device that provides an external source of energy for an acoustic. transducer. "Ultrasonics" refers to sound waves above the limit of normal human hearing. This is generally considered to be above approximately 18 kHz.

High power ultrasonic transducers and ultra-high power ultrasonci transducers are disclosed. The transducers each include a housing having a predetermined geometry and one or more motor assemblies. Each motor assembly has one or more active elements made from a smart material, such as a magnetostrictive material. Each motor assembly also is connected to means for producing an electromagnetic field that extends through at least a portion of the active element. Each active element is changeable between a first shape when in the absence of an electromagnetic field or in a low magnetic field and a second or elongated shape when in the presence of the electromagnetic field or in a higher magnetic field. Means for providing an electrical signal to the means for producing an electromagnetic field is included. An acoustic element is connected to the transducer for channeling ultrasonic energy to perform work.

Figure 1:
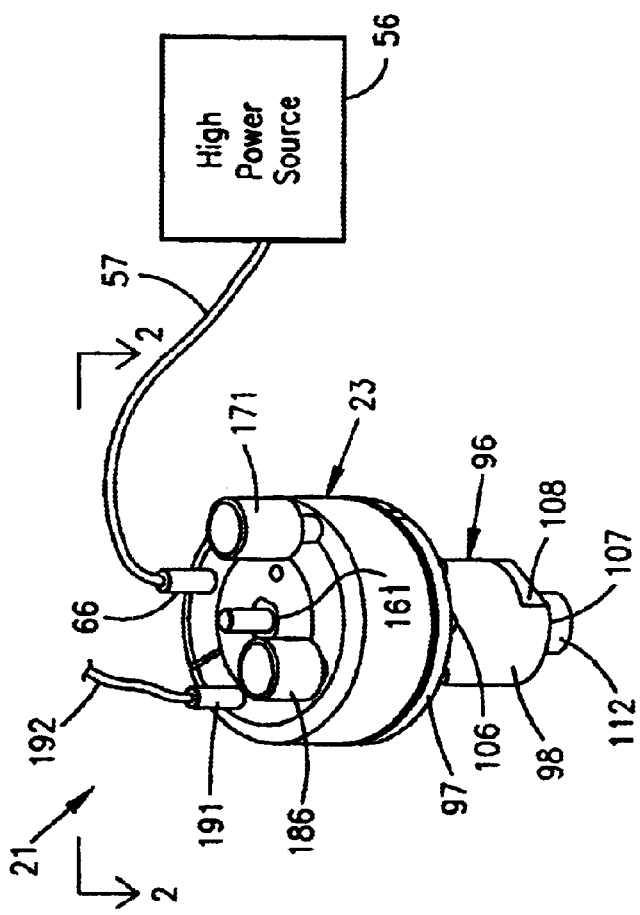
FIG. 1 is an isometric view of an ultrasonic transducer in one embodiment of the present invention.
Figure 3:
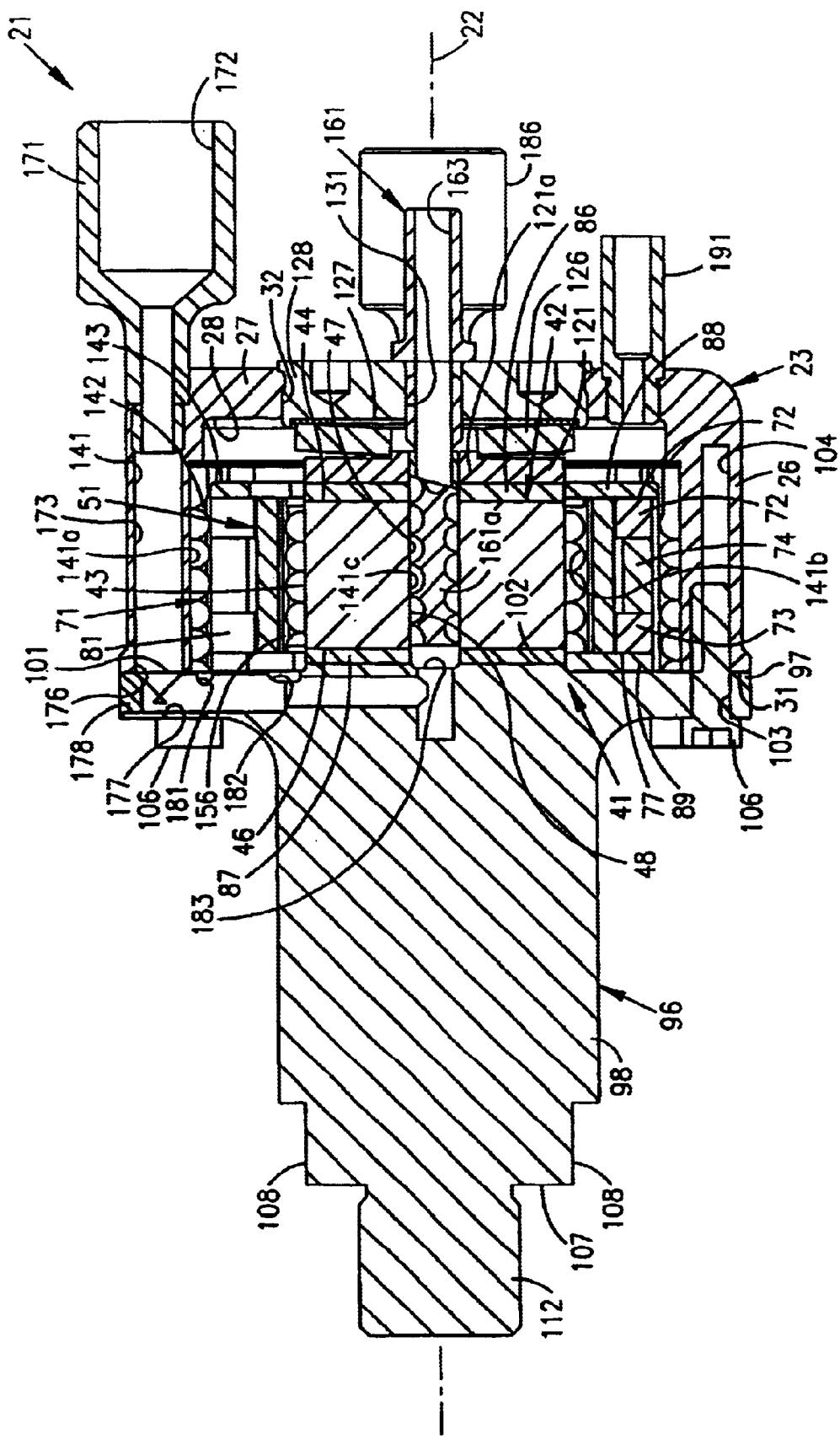
FIG. 3 is a cross-sectional view of the ultrasonic transducer of FIG. 1 taken along line 3—3 of FIG. 2 in one embodiment of the present invention.
Figure 4:
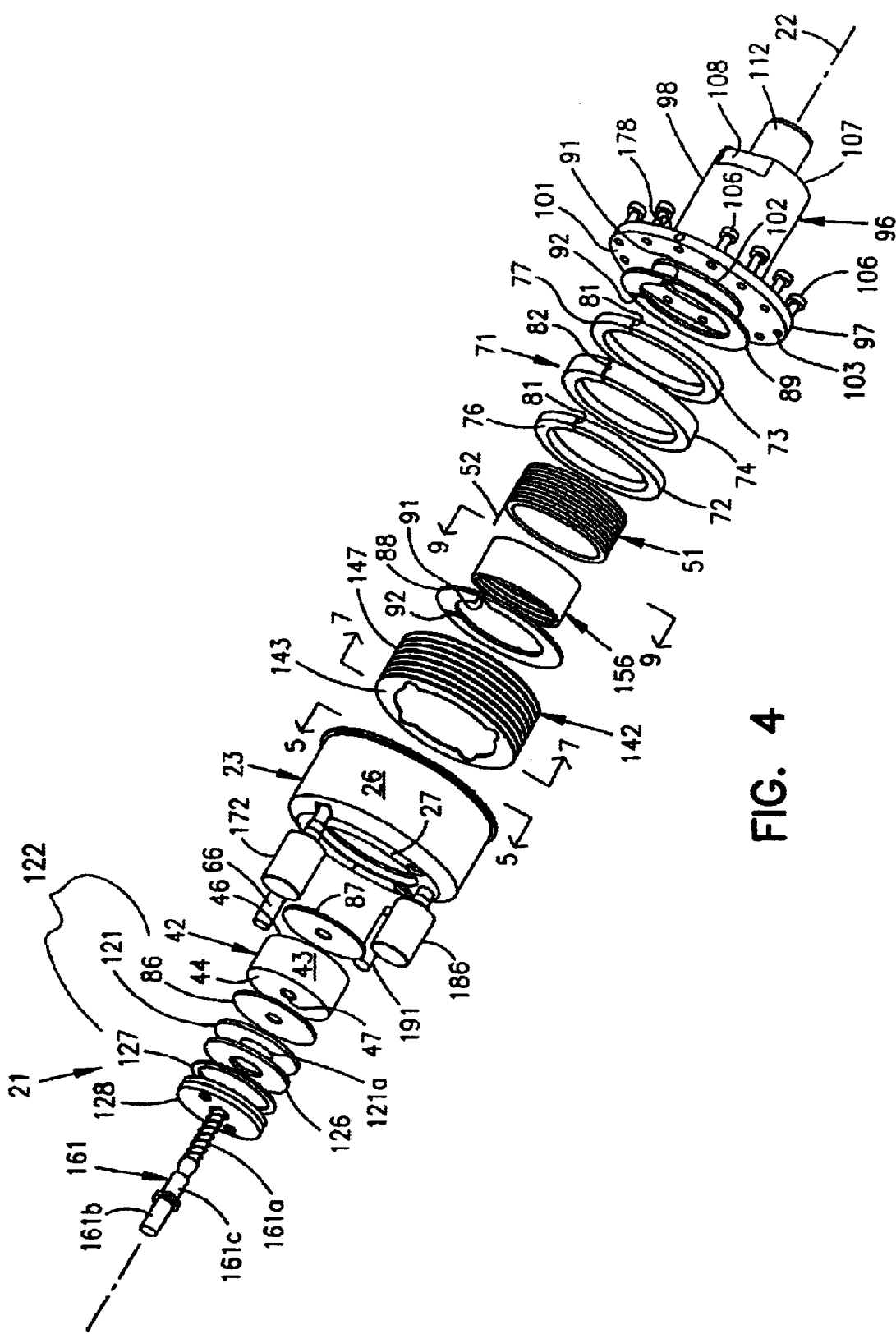
FIG. 4 is an exploded view of the ultrasonic transducer of FIG. 1 in one embodiment of the present invention.

The high power ultrasonic transducer 21 in one embodiment of the present invention is cylindrical in conformation and concentrically disposed about a central longitudinal axis 22 (See FIGS. 1, 3 and 4). The transducer 21 can be of any suitable size. In one embodiment, the transducer 21 is less than about 7.6 cm (about three (3) in) in diameter and less than about 12.7 cm (about five(5) in) in length. In another embodiment, the transducer 21 is at least about 1.3 cm (0.5 in) in diameter and about 2.5 cm (one (1) in) in length. In a specific embodiment, the transducer 21 has a diameter of approximately 7.6 cm (about three (3) in) and a length of approximately 12.7 cm (about five(5) in). A housing member or transducer housing (hereinafter "housing") 23 of predetermined geometry is included within the transducer 21.

The housing 23 can have any suitable geometry. In the embodiments shown in FIGS. 1–4 and separately in FIGS. 5 and 6, the housing 23 has an outer cylindrical wall 26 which is circular in cross-section and has a generally planar end wall 27 extending across one end of the outer cylindrical wall 26. The other end of the outer cylindrical wall 26 is open for accessing an internal chamber 28 of the housing 23. The internal chamber 28 is formed by a cylindrical wall 26 and an end wall 27. The open end of the cylindrical wall 26 is provided with an annular planar face 31 extending at a right angle to the longitudinal axis 22. A central circular opening 32 extends through the end wall 27 into the internal chamber 28. The housing 23 is made from any suitable material, such as 6-4 titanium (six (6) percent aluminum, four (4) percent vanadium). In one embodiment, the cylindrical wall 26 has an outer diameter of approximately 7.2 cm (about 2.9 in), an inner diameter of approximately 5.8 cm (about 2.3 in) and a length from end to end of approximately 3.7 cm (about 1.45 in). In this embodiment, the end wall 27 has a thickness of approximately 0.64 cm (about 0.25 in) and the central circular opening 32 has a diameter of approximately 3.8 cm (about 1.5 in). The housing 23 is provided with a radially-extending slit 33 which extends longitudinally through the housing 23 for precluding electrical currents from traveling circumferentially around the motor housing. Any such currents in the housing 23 produce unwanted electromagnetic fields and heat which disrupt the efficiency of the ultrasonic transducer 21. The slit 33 can be of any suitable size. In one embodiment, the slit 33 has a thickness of approximately 0.1 cm (0.04 in) and extends radially inwardly from the outside of housing 23 a distance of approximately 1.52 cm (0.60 in).

A motor assembly or motor 41 is carried by the housing 23 and, more specifically, is disposed within an internal chamber 28. The motor assembly 41, as shown in FIGS. 3 and 4, includes a cylindrical or rod-like member in the form of a drive rod 42 made from any suitable active or smart material, a material that can transduce mechanical energy to either electric or magnetic energy and vice versa. Smart materials are known to exhibit a change in shape in response to a change in input from an external parameter. Essentially, smart materials have the ability to "sense" their environment. Smart materials include magnetostrictive materials, such as ETREMA TERFENOL-D®, a metal alloy formed from the elements terbium, dysprosium and iron, fabricated by ETREMA Products, Inc., in Ames, Iowa, under the brand name of "TERFENOL-D." Other magnetostrictive materials include, but are not limited to, nickel, "Gafenol" (a gallium-iron alloy currently under development), ferrous metals, vandium permendur, metallic glass, and so forth. Smart materials also include materials such as piezoelectrics, ferroelectrics, piezoceramics, and so forth. External parameters which can be varied in order to cause the change in compliance to occur, include, but are not limited to, mass load, electrical load, prestress, and temperature, as well as ac and dc applied fields (or polarization fields), including electric, thermal and/or magnetic fields, as appropriate for different smart materials. For example, magnetostrictive materials such as TERFENOL-D, are known to change shape in response to changes in (or application of) an applied magnetic field. Such variations in the magnetic field can be induced by providing a dc current to the motor or by varying the magnetic field strength. A magnetostrictive material can tolerate high mechanical stress, and has a relatively high energy density. High energy density enables more mechanical power output from more electrical power input and volume of smart material which thus reduces the size and weight of the transducer 21.

In a particular embodiment, a giant magnetostrictive material is used for the drive rod 42. Giant magnetostrictives are known to have a high tolerance for mechanical stress resulting from magnetic moment alignment. As a result, a drive rod made from a giant magnetostrictive has a relatively high transduction capability, and the coupling coefficient can be as high as 0.75. High transduction capability, along with high energy density, enable more mechanical power output from a given electrical power input and volume of smart material and thus reduce the size and weight of actuator. Such giant magnetostrictive materials also have the ability to maintain performance at high temperatures and have inherent high reliability. Examples of giant magnetostrictive materials include rare earth materials, rare earth-transition metal materials and compositions having rare earth materials, transition metals and other elements.

For operating temperatures ranging from 0° to 200° K., rare earth binary alloys, such as $Tb_xDy_{1-x}$, where x ranges from 0 to 1, can be used. Other rare earth elements can be added or substituted for either terbium or dysprosium in this base alloy. For example, holmium (Ho), erbium (Er), gadolinium (Gd), lanthanum (La), cerium (Ce), praseodymium (Pr), neodymium (Nd), samarium (Sm) or yttrium (Y) can be used in place of either terbium or dysprosium. Other preferred rare earth materials for operating temperatures ranging from 0° to 200° K. are body-centered cubic intermetallic compounds such as $(Tb_xDy_{x-1})(Zn_yCd_{1-y})$, where x ranges from 0 to 1, y ranges from 0 to 1 and x+y=1. Other rare earth elements, such as holmium, erbium, gadolinium, lanthanum, cerium, praseodymium, neodymium, samarium or yttrium, can be added or substituted for either terbium or dysprosium in these body-centered cubic intermetallic compounds.

Rare earth-transition metal materials suited for operating in temperatures ranging from 0° to 600° K. have the formula $(R_{x1}, R_{x2} \ldots R_{x11})(M_{y1}M_{y2} \ldots M_{y6})_z$ where each R is a rare earth element, such as lanthanum, cerium, praseodymium, neodymium, samarium, gadolinium, terbium, dysprosium, holmium, erbium or yttrium. Any combination of these elements can be provided in said formula, as will be understood by the examples set forth below. In said formula, $0 \leq x1 \leq 1$, $0 \leq x2 \leq 1$ . . . $0 \leq x11 \leq 1$, that is, $0 \leq x1 \leq 1$, $0 \leq x2 \leq 1$, $0 \leq x3 \leq 1$, $0 \leq x4 \leq 1$, $0 \leq x5 \leq 1$, $0 \leq x6 \leq 1$, $0 \leq x7 \leq 1$, $0 \leq x8 \leq 1$, $0 \leq x9 \leq 1$, $0 \leq x10 \leq 1$ and $0 \leq x11 \leq 1$. In addition, x1+x2+ . . . +x11=1, that is, x1+x2+x3+x4+x5+x6+x7+x8+x9+x10+x11=1.

The composition of the rare earth atoms provides for the anisotropy of magnetostriction, the property which yields the giant magnetostrictive response of the alloy. Each "M" in said formula is a transition metal, other metal, semi-metal or metalloid and preferably one of the following elements: iron (Fe), manganese (Mn), cobalt (Co), nickel (Ni), aluminum (Al), silicon (Si) or beryllium (Be). As will be understood by the examples set forth below, any combination of these elements can be provided in said formula. In the formula, $0 \leq y1 \leq 1$, $0 \leq y2 \leq 1$ . . . $0 \leq y6 \leq 1$, that is, $0 \leq y1 \leq 1$, $0 \leq y2 \leq 1$, $0 \leq y3 \leq 1$, $0 \leq y4 \leq 1$, $0 \leq y5 \leq 1$, and $0 \leq y6 \leq 1$. In addition, y1+y2+. . . +y6=1, that is, y1+y2+y3+y4+y5+y6=1, and $1.8 \leq z \leq 2.1$. The composition of the transition metals, other metals, semi-metals and/or metalloids in the final alloy affects the magnetic properties of the alloy allowing for optimization of the alloy to a wide variety of uses. Exemplary rare earth-transition metal materials for operating in the 0° to 600° K. temperature range are disclosed in U.S. Pat. Nos. 4,308,474; 4,609,402; 4,770,704; 4,849,034; 4,818,304 and 5,110,376, all of which are hereby incorporated by reference in their entirety.

In one embodiment, the drive rod 42 is made from TERFENOL-D. TERFENOL-D has the formula $(Tb_xDy_{1-x})Fe_{1.8-2.1}$, where $0 \leq x \leq 1$. In one embodiment, the drive rod 42 is made from TERFENOL-D having the formula: $Tb_xDy_{1-x}Fe_{1.90-1.95}$ where x ranges from 0.25 to 1.0. In a particular embodiment, the drive rod 42 is made from TERFENOL-D having the specific formula $Tb_{0.3}Dy_{0.7}Fe_{1.92}$. Other suitable rare earth-iron materials included in said formula are:

$(Tb_{x1}Dy_{1-x1})_1(Mn_{y1}Fe_{1-y1})_{1.8-2.1}$, where $0 \leq x1 \leq 1$ and $0 \leq y1 \leq 0.5$;

$(Tb_{x1}Dy_{1-x1})_1(Co_{y1}Fe_{1-y1})_{1.8-2.1}$, where $0 \leq x1 \leq 1$ and $0 \leq y1 \leq 1$;

$(Tb_{x1}Dy_{1-x1})_1(Ni_{y1}Fe_{1-y1})_{1.8-2.1}$, where $0 \leq x1 \leq 1$ and $0 \leq y1 \leq 1$;

$(Tb_{x1}Dy_{1-x1})_1(Al_{y1}Fe_{1-y1})_{1.8-2.1}$, where $0 \leq x1 \leq 1$ and $0 \leq y1 \leq 0.1$;

$(Tb_{x1}Dy_{-x1})_1(Al_{y1}Mn_{y2}Fe_{1-y1-y2})$, where $0 \leq x1 \leq 1$, $0 \leq y1 \leq 0.1$ and $0 \leq y2 \leq 0.5$;

$(Tb_{x1}Dy_{1-x1-x2}Ho_{x2})_1(Al_{y1}Fe_{1-y1})_{1.8-2.1}$, where $0 \leq x1 \leq 1$, $0 \leq x2 \leq 0.5$, $x1+x2 \leq 1$ and $0 \leq y1 \leq 0.1$;

$(Tb_{x1}Dy_{1-x1})_1(Co_{y1}Mn_{y2}Fe_{1-y1-y2})_{1.8-2.1}$, where $0 \leq x1 \leq 1$, $0 \leq y1 \leq 1$, $0 \leq y2 \leq 0.5$, and $y1+y2 \leq 1$;

$(Tb_{x1}Dy_{1-x1-x2}Ho_{x2})_1(Co_{y1}Mn_{y2}Fe_{1-y1-y2})_{1.8-2.1}$ where $0 \leq x1 \leq 1$, $0 \leq x2 \leq 0.5$, $x1+x2 \leq 1$, $0 \leq y1 \leq 1$, $0 \leq y2 \leq 0.5$ and $y1+y2 \leq 1$;

Rare earth-transition metal materials which contract and thus exhibit negative magnetostriction when placed in a magnetic field are also included in said formula and preferably include the rare earth element samarium. In one embodiment, the material is SAMFENOL-D having the formula $(Sm_{x1}Dy_{1-x1})Fe_{1.8-2.1}$, where $0 \leq x1 \leq 1$. Other suitable negative magnetostrictive materials are:

$(Sm_{x1}Ho_{l-x1})_1Fe_{1.8-2.1}$, where $0 \leq x1 \leq 1$; and $(Sm_{x1}Dy_{1-x1})_1(Co_{y1}Fe_{1-y1)1.8-2.1}$, where $0 \leq x1 \leq 1$ and $0 \leq y1 \leq 1$.

TERFENOL-D is known to provide high performance, in part, because its crystalline alignment is fixed. As such the material will not "de-pole," thus yielding constant performance over time. TERFENOL-D further has a high energy density, delivering higher power in a smaller package as compared to conventional materials. TERFENOL-D also has good thermal conductivity as noted above, making high power, continuous duty operation possible, without derating input. TERFENOL-D further has a large strain output. Specifically, a transducer using TERFENOL-D does not require a high Q system to produce displacement. Such a device can operate into heavily damped loads. Furthermore, such devices do not require frequency operations of +/−0.5% around resonance as with PZT. Magnetostrictive materials, such as TERFENOL-D, also have a desirably wide operating temperature environment ranging from approximately −100° C. to +380° C.

In determining the power consumption of a TERFENOL-D rod, magnetic hysteresis and eddy currents have to be calculated. Eddy currents depend on the magnetic permeability and electrical resistivity of the rod. Although TERFENOL-D is considered to be anisotropic, measurements performed by the Department of Energy's Ames Laboratory ("Ames Lab") in Ames, Iowa, found both electrical and thermal properties of TERFENOL-D to be isotropic. Specifically, the electrical resistivity was measured as 58 μohm-cm at room temperature. This value is very close to the generally used value of 60 μohm-cm. The thermal conductivity was measured at 13.5 W/m-K. However, TERFENOL-D is generally considered to have a thermal conductivity of about 10.5 W/m-K. This represents a difference of about 28%. (Therefore, in terms of a 30 kW transducer, for example, the internal rod temperature may be about 23% lower for any given method of cooling). In general, however, the thermal conductivity of TERFENOL-D can be considered to range from about ten (10) to 13.5 W/m-K.

The drive rod 42 is formed with an outer cylindrical surface 43 and first and second planar end surfaces 44 and 46 extending perpendicular to longitudinal axis 22 and parallel to each other. The drive rod 42 can have any suitable geometry. In one embodiment, the drive rod 42 has a diameter of approximately 3.18 cm (about 1.25 in) and a length between end surfaces 44 and 46 of approximately 1.78 cm (about 0.7 in). In this embodiment, a central bore 47 extends along the central longitudinal axis 22 between the end surface 48 having a diameter of approximately 0.64 cm (about 0.25 in). In one embodiment, the drive rod 42 is a laminated TERFENOL-D rod. Lamination helps to control eddy currents therein. Furthermore, flux penetration into the drive rod 42 from the electromagnetic field (discussed below) is essentially 100% and power losses are reduced dramatically, i.e., by 50 times, as compared with a non-laminated solid "puck" of material.

The motor assembly 41 includes a drive coil 51 that serves as means for producing an electromagnetic field extending through at least a portion of the active drive rod 42 (see FIGS. 3 and 4). The drive coil 51 is concentrically disposed about the drive rod 42 within the internal chamber 28 and generates an electromagnetic field which extends through the entire drive rod 42. The drive coil 51 can be made from any suitable material, such as an electrically conductive wire (hereinafter "coil wire") 52. In one embodiment, the drive coil 51 is made from "18 AWG S build" square copper wire 52 wound in place with "EPO-TEK T7109" epoxy made by Epoxy Technology of Billercia, Mass. In this embodiment, the electrically conductive wire 52 has a direct current resistance at 22° C. of approximately 0.09 ohms. The drive coil 51 can be wound with any suitable number of layers. In one embodiment, the drive coil 51 is wound with two layers of wire 52 and has at least 17 turns per layer. The drive coil 51 can be any suitable length. In one embodiment, the drive coil 51 has a length of approximately 1.9 cm (about 0.74 in), an external diameter of approximately 4.3 cm (about 1.7 in) and an internal diameter of approximately 3.8 cm (about 1.5 in).

A high power source 56 is included within the means of the ultrasonic transducer 21 for providing an electrical signal to the motor assembly 41 (see FIG. 1). Power can be provided from any suitable source of energy, including, but not limited to, a generator, conventional batteries, a solar energy system having solar panels and storage batteries, or a normal power grid system. The transducer 21 can operate on either alternating current (Ac) or direct current (Dc), and the voltage can be any suitable voltage such as 12 volts or 120 volts, depending on the source of the power. In one embodiment, a battery pack system is used. In this embodiment, the battery pack supplies Dc power to a conversion circuit. The conversion circuit converts the Dc power to any desired frequency range, such as from about one (1) Hz to 50 kHz. A controller can also be used to adjust the amplitude and frequency for a particular application. In an alternative embodiment, an Ac line source of any origin can be used. The Ac source is converted to any desired frequency range, such as from about one (1) Hz to 50 kHz. The magnitude and frequency of the oscillations can also be controlled for a particular application. Additionally, the power source 56 may be of the continuous or impulse type.

The power source 56 provides power in the range from 10 watts to 50 kW to the transducer. In one embodiment, power is provided in excess of three (3) kW. In a specific embodiment, the power source 56 provides about six (6) kW of power to the motor assembly 41 in the form of an ultrasonic three phase sinusoidal signal of approximately 150 volts and 40 amps. In another specific embodiment, about 30 kW of power is provided in the form of a high power ultrasonic three phase sinusoidal signal of approximately 375 volts and 80 amps. An electrical wire 57, shown for simplicity only in FIG. 1, couples the power source 56 to the free end of the coil wire 52. The end wall 27 of the housing 23 is provided with a first, second and third angularly spaced-apart bores 61, 62 and 63 for communicating with the internal chamber 28 (see FIG. 5). The angular spacing between the first and second bores 61 and 62 and between the second and third bores 62 and 63 is each approximately 90°. A tubular strain relief 66 is disposed at one end in the first bore 61. The electrical wire 57 extends from the power source 56 through the strain relief 66 and the first bore 61. The electrical wire 57 is also electrically connected to the coil wire 52.

A magnetic means 71, such as a tubular magnetic means, is provided in the ultrasonic transducer 21 for continuously biasing the drive rod 42 (see FIGS. 3 and 4). The tubular magnetic means 71 is comprised of permanent magnets. The tubular magnetic means 71 has first and second opposite end portions consisting of first and second annular bias magnets 72 and 73 and a central portion consisting of a third or central annular bias magnet 74. The central bias magnet 74 is disposed between the first and second bias magnets 72 and 73. The bias magnets 72–74 can be manufactured to have any one of a number of different polarizations. The bias magnets 72–74 are made from a hard magnetic material and can be of any suitable type, such as many of the different grades of neodymium iron boron magnets. Alternatively, the bias magnets 72–74 can be made from materials such as samarium cobalt.

The bias magnets 72–74 comprising the tubular magnetic means 71 are sized and shaped to produce a uniform dc magnetic field through the drive rod 42. The greater radial thicknesses of the first and second bias magnets 72 and 73 relative to the radial thickness of the central bias magnet 74 provides such a uniform dc magnetic bias. The bias magnets 72–74 can be any suitable size and shape. In one embodiment, the first and second bias magnets 72 and 73 each have a longitudinal dimension or length of approximately 0.5 cm (about 0.2 in) and outer and inner diameters of approximately 5.3 cm (about 2.1 in) and 4.4 cm (about 1.7 in), respectively. In this embodiment, the central bias magnet 74 has a length of approximately 0.89 cm (about 0.35 in) and outer and inner diameters of approximately 5.3 cm (about 2.1 in) and 4.5 cm (about 1.8 in), respectively. The central bias magnet 74 further has a radial thickness that is less than the radial thickness of the first and second bias magnets 72 and 73. This is due to the central bias magnet having an inner diameter that is greater than the inner diameter of magnets 72 and 73.

As shown in FIG. 3, the tubular magnetic means 71 is concentrically disposed about the drive coil 51. The bias magnets 72–74 have an aggregate length approximately the same length of the drive coil 51. The first bias magnet 72 has an outer, planar end surface 76 which is longitudinally aligned with one end surface of the drive coil 51. The second bias magnet 73 has an outer, planar end surface 77 which is longitudinally aligned with the other end surface of the drive coil 51. The first and second bias magnets 72 and 73 each have a slit 81. In one embodiment, the slit 81 is approximately 0.1 cm (about 0.04 in) thick extending radially therethrough. The central bias magnet 74 is also provided with a slit 82. In one embodiment, the slit 82 has a thickness of approximately 0.1 cm (about 0.04 in) extending radially therethrough. The slits 81 and 82 are longitudinally aligned and extend in a direction parallel to the longitudinal axis 22 for precluding electrical currents from traveling circumferentially around the bias magnets. As discussed above, such currents can create unwanted magnetic fields and heat which disrupt the desired performance of the motor assembly 41.

The first and second flux return means are carried by the housing 23 within the internal chamber 28 for capturing the dc magnetic field created by the bias magnets 72–73 and directing this dc field through the drive rod 42 (see FIGS. 3 and 4). The first and second flux return means also capture the ac magnetic field generated by the drive coil 51 and channel this ac field into the drive rod 42. The first and second flux return means include the first and second inner annular disk-like members or magnetic disks 86 and 87 and the first and second annular ring members or magnetic rings 88 and 89.

The disks 86 and 87 and rings 88 and 89 are each made from any suitable ferromagnetic or soft magnetic material having a relatively low electrical conductivity and a relatively high electrical resistivity. The flux return elements 86–89 also have a relatively high magnetic saturation flux density. In one embodiment, the material of elements 86–89 has an electrical resistivity greater than 1000 ohm-cm, although a more practical electrical resistivity range is between about 0.01 and 1000 ohm-cm. In one embodiment, the magnetic saturation flux density is between about 8,000 and 12,000 gauss. In another embodiment, the saturation flux density is between about 12,000 and 20,000 gauss. In yet another embodiment, the saturation flux density is greater than about 20,000 gauss.

A suitable material for elements 86–89 is the material marketed under the trade name "High Flux" by Arnold Engineering of Marengo, Ill. and Magnetics of Butler, Pa. High Flux is a nickel and iron alloy having the composition of 0.5 nickel and the balance iron. The nickel and iron elements of the High Flux material are ground into micron and sub-micron particle sizes. A dielectric is sprayed on the particles to electrically insulate them. The resulting powder mix is then compressed at roughly $1.38 \times 10^9$ N/m$^2$ (about 100 tons per square inch) to make a solid component which is the equivalent of a sandstone structure. Another suitable material is iron powder marketed by MMG-North America of Paterson, N.J. or ProEngCo of Lund, Sweden. The iron powder has a composition of greater than about 95% iron. The iron powder is produced in a manner similar to the method for producing High Flux described above. Briefly, the iron elements are ground into micron and sub-micron particle sizes. A dielectric is sprayed on the particles to electrically insulate them. The resulting powder mix is compressed to make a solid component that is the equivalent of a sandstone structure. In one embodiment, each of these materials has an electrical resistivity ranging from about 0.01 to 50 ohm-cm and a magnetic saturation flux density ranging from about 12,000 to 15,000 gauss. High Flux has a high relative permeability which makes it a better magnetic flux conductor.

The disks 86 and 87 can be of any desired geometry and size. In one embodiment, the first magnetic disk 86 has a longitudinal dimension or thickness of approximately 0.25 cm (about 0.1 in) and outer and inner diameters of approximately 3.2 cm (about 1.3 in) and 0.64 (about 0.25 in), respectively. The second magnetic disk 87 has a longitudinal dimension or thickness of approximately 0.18 cm (about 0.07 in) and outer and inner diameters of approximately 3.2 cm (about 1.3 in) and 0.64 (about 0.25 in), respectively. The disks 86 and 87 are each centered on the longitudinal axis 22 with the first magnetic disk 86 butting the second end surface 46 of the drive rod 42.

The first and second magnetic rings 88 and 89 can also be of any desired geometry and size. In one embodiment, each ring has a longitudinal dimension or thickness of approximately 0.2 cm (about 0.08 in) and outer and inner diameters of approximately 5.3 cm (about 2.1 in) and 3.3 cm (about 1.3 in), respectively. Each of the rings 88 and 89 is provided with a cutout 91. In one embodiment the cutout 91 is in the shape of a half-moon on the inside thereof and a radially-extending slit 92 extending therethrough. In a particular embodiment, the slit 92 has a thickness of approximately 0.3 cm (0.12 in). The cutout 91 in the first ring 88 permits the coil wire 52 to pass through the ring 88 and exit the internal chamber 28 for electrical coupling to the wire 57 and thus power source 56. The slits 92 preclude electrical currents from traveling circumferentially around the rings 88 and 89 for the same reasons discussed above with respect to slits 33, 81 and 82. The first magnetic ring 88 abuts the end surface 76 of the first bias magnet 72. The corresponding end of the drive coil 51 and the second magnetic ring 89 abuts the end surface 77 of the second bias magnet 73 and the corresponding end of the drive coil 51.

An acoustic element or extension (hereinafter "wave-guide") 96 is included within the ultrasonic transducer 21 and, among other things, serves to close the open end of the housing 23. As shown most clearly in FIGS. 3 and 4, the wave-guide 96 includes a flange portion 97 and a cylindrical portion 98, each of which are centered on longitudinal axis 22. In one embodiment, the disk-like flange portion 97 has a longitudinal dimensional or thickness of approximately 0.57 cm (about 0.225 in) and an external diameter of approximately 7.4 (about 2.9 in). The flange portion 97 has a generally planar surface or face 101 which abuts and matters with the annular planar face 31 of the motor housing 23. A central planar surface 102 is provided at the center of the face 101. In one embodiment, the central surface 102 has an outer diameter of approximately 3.19 cm (about 1.255 in) and is parallel to face 101. Central surface 102 is spaced outwardly from face 101 a distance of approximately 0.09 (about 0.035 in). A plurality of twelve circumferentially spaced-apart flange bores 103 extend longitudinally through the flange portion 97 and longitudinally align with an equal plurality of threaded bores 104 extending longitudinally into the planar face 31 of the housing 23, although the invention is not so limited. Any number of flange bores 103 and threaded bores 104 can be used. A cap screw 106 extends through each of the flange bores 103 and threadably engages a corresponding threaded bore 104 in the housing 23 to secure the wave-guide 96 to the housing 23.

The cylindrical portion 98 is integral with the flange portion 97 and extends from the flange portion 97 in a direction away from the face 101. An annular planar surface 107 extending parallel to the face 101 forms the other end of the wave-guide 96. Two oppositely aligned cutouts or flats 108 are formed in the cylindrical portion 98 adjacent the end surface 107 for facilitating gripping and rotating of the ultrasonic transducer 21 with a wrench. A threaded stub 112 is integral with the cylindrical portion 98 and protrudes perpendicularly from end surface 107. In one embodiment, the threaded stub 112 protrudes a distance of approximately 1.8 cm (about 0.7 in).

The wave-guide 96 is made from any suitable material, such as an acoustic metal. Suitable acoustic metals are aluminum alloys, magnesium alloys, titanium and titanium alloys. In one embodiment, magnesium alloys that are high Q/low damping materials are used. These include, but are not limited to materials being of the following American Society for Testing and Materials (ASTM) type: AZ31B-F$^c$ and AZ31B-H24 each having percentage compositions of aluminum, zinc and magnesium ranging from 2.5 to 3.5, 0.7 to 1.3 and at least 0.20, respectively; AZ61A-F having percentage compositions of aluminum, zinc and magnesium ranging from 5.8 to 7.2, 0.4 to 1.5 and at least 0.15, respectively; AZ80A-T5 having percentage compositions of aluminum, zinc and magnesium ranging from 7.8 to 9.2, 0.2 to 0.8 and at least 0.15, respectively; ZK60A-T5 having percentage compositions of zinc and zirconium ranging from 4.8 to 6.2 and at least 0.45, respectively; and HK31A-H24 having percentage compositions of thorium and zirconium ranging from 2.5 to 4.0 and 0.45 to 1.0, respectively. These materials each have a Q (quality factor) that is greater than about 100 and a high fatigue strength ranging from about 18,000 to 30,000 psi. In one embodiment, AZ80A-T5, ZK60A-T5, AZ31B and AZ61A-F are used for wave-guide 96. In another embodiment, AZ80A-T5 is used because it has a relatively high electrical resistivity of approximately 12.2 $\mu$ohm-cm.

The wave-guide 96 can be of any suitable size and shape. In one embodiment, the wave-guide 96 has a longitudinal dimension or length measured from central face 102 to end surface 107 of approximately 6.35 cm (about 2.5 in), which is substantially equal to the quarter resonant wavelength of the material of the wave-guide 96. Accordingly, the wave-guide 96 is sized to vibrate from the motor assembly 41 at its resonant frequency.

The stack of second magnetic disk 87, drive rod 42 and first magnetic disk 86 are disposed in the internal chamber 28 (see FIG. 3). The second magnetic disk 87 abuts the central surface 102. The drive coil 51 extends around the drive rod 42 and is stacked between the first and second magnetic rings 88 and 89. The second magnetic ring 89 abuts the face 101 of the flange portion 97. The first bias magnet 72, central bias magnet 74 and second bias magnet 73 are stacked between the first and second magnetic rings 88 and 89 outside the drive coil 51.

The first magnetic disk 86, a preload disk 121 and part of the Belleville spring 126 together comprise a reaction mass 122. The reaction mass 122 is essentially the mass against which the drive rod 42 pushes. The preload disk 121 can be made from any suitably hard material, such as 17-4PH stainless steel. In one embodiment, the preload disk 121 has a longitudinal dimension or thickness of approximately 0.25 cm (about 0.1 in) and outer and inner diameters of approximately 3.19 cm (about 1.26 in) and 0.64 cm (about 0.245 in), respectively. The preload disk 121 has a raised central portion 121*a*. In one embodiment, the raised central portion 121*a* has a diameter of approximately 1.14 cm (about 0.45 in). In this embodiment, the raised central portion 121 a has a longitudinal dimension or thickness of approximately 0.1 cm (about 0.04 in). The preload disk 121 is sized with a specific mass so that the combined mass of the reaction mass 122 causes the drive rod 42 operate at its resonant frequency.

Means is included within the ultrasonic transducer 21 for imparting a preload on the drive rod 42. Such means includes the Belleville spring 126, a preload bearing disk 127 and a preload plate 128. The Belleville spring 126 can be of any suitable type, such as part number BEL-2401-2410 made by HK Metalcraft of Lodi, N.J. The preload bearing disk 127, which precludes the Belleville spring 126 from embedding within the preload plate 128, can be made from any suitable material such as "1095 Blue Hardened" spring steel, a blue-tempered spring steel sold by McMaster Carr of Chicago, Ill. In one embodiment, the preload bearing disk 127 has a longitudinal dimension or thickness of approximately 0.08 cm (about 0.03 in) and outer and inner diameters of approximately 3.6 cm (about 1.4 in) and 12.54 cm (about 1.0 in), respectively. The preload plate 128 is disk-like in shape and made from any suitable material such as 6-4 titanium. The preload plate 128 has an outer cylindrical surface which is threaded and diametrically sized to threadably engage the central opening 32 of the motor housing 23. A threaded bore 131 extends through the center of the preload plate 128. In one embodiment, the preload plate 128 is rotatably tightened within the central opening 32 so as to provide a preload on the drive rod 42 ranging from about 8900 to 17,800 Newtons (N) (about 2000 to 4000 lb$_f$). In a specific embodiment, approximately 15,600 N (about 3500 lb$_f$) of preload is provided.

Active cooling means is provided in the ultrasonic transducer 21 for extending the duty cycle of the transducer 21 and enhancing the performance thereof. The active cooling means includes a fluid passageway 141 having portions extending about the drive rod 42, drive coil 51 and tubular magnetic means 71. The fluid passageway 141 is adapted to permit any suitable cooling fluid to flow through the ultrasonic transducer 21 for the cooling the motor assembly 41 and other motor components. Any synthetic heat transfer fluid, such as the fluid having the trade name "Multitherm 503" made by Multitherm Corporation of Colwyn, Pa., is a suitable cooling fluid for the ultrasonic transducer 21. In one embodiment, phase change fluids are used, as is described in greater detail with respect to the high power embodiment below.

The fluid passageway 141 has three helical portions consisting of a first or outer helical portion 141a, a second or middle helical portion 141b and a third or central helical portion 141c. The outer helical portion 141a, as shown in FIG. 3, extends circumferentially around the outside of the tubular magnetic means 71 and is formed in part by the inner surface of the cylindrical wall 26. The outer helical portion 141a is further formed by a tubular member consisting of an outer cooling fixture 142, illustrated separately in FIGS. 7 and 8, which extends around the tubular magnetic means 71. In one embodiment, the cooling fixture 142 has a longitudinal dimension or length of approximately 2.54 cm (about one (1) in) and outer and inner diameters of approximately 5.8 cm (about 2.3 in) and 5.3 cm about 2.1 in), respectively. A disk-like ring 143 is formed at one end of the cooling fixture 142. In one embodiment, the ring 143 is provided with a central opening 146 having an internal diameter of approximately 4.4 cm (about 1.75 in). The outer cylindrical surface of the cooling fixture 142 is formed with a helical channel 147 provided in one embodiment, with at least six turns (see FIGS. 4 and 8). In this embodiment, the channel 147 has a radius of approximately 0.15 cm (about 0.06 in). Two diametrically opposed cutouts 148 are provided in the ring 143 for communicating with the helical channel 147, although the invention is not so limited. Any suitable number of cutouts 148 can be provided. The outer cooling fixture 142 is disposed in the internal chamber 28 so that the ring 143 is positioned close to end wall 27 of the housing 23.

Figure 10:
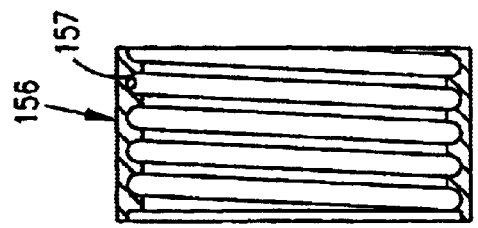
FIG. 10 is a cross-sectional view of the ultrasonic transducer of FIG. 1 taken along the line 10—10 of FIG. 9 in one embodiment of the present invention.
Figure 9:
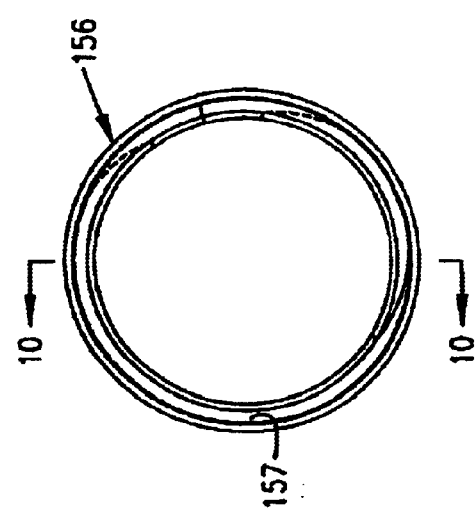
FIG. 9 is a sectional view of the ultrasonic transducer of FIG. 1 taken along line 9—9 of FIG. 4 in one embodiment of the present invention.

The ultrasonic transducer 21 has means that includes a second tubular member or inner cooling fixture 156 for forming a middle helical portion 141b of the fluid passageway 141. In one embodiment, the inner cooling fixture 156, as shown separately in FIGS. 9 and 10, has a longitudinal dimension or length of approximately 1.88 cm (about 0.74 in) and outer and inner diameters of approximately 3.8 cm (about 1.5 in) and 3.2 cm (about 1.26 in), respectively. The inner cylindrical surface of cooling fixture 156 is formed with a helical channel 157 having at least five turns. In one embodiment, the channel 157 has a radius of approximately 0.15 cm (about 0.06 in). As shown in FIG. 3, the inner cooling fixture 156 is disposed between the drive coil 51 and the drive rod 42. The outer cylindrical surface 43 of the drive rod 42 forms the inner surface of the middle helical portion 141b of the fluid passageway 141.

The outer and inner cooling fixtures 142 and 156 are each made from an electrically insulating or nonconductive material. Suitable materials are ceramics such as boron nitride, alumina, silicon carbide, boron carbide, silicon nitride, beryllia, and silicon, including all compositions, variations and grades of the foregoing. Another suitable material is aluminum nitride. In one embodiment, hot pressed boron nitride is used as the material for the cooling fixtures 142 and 156. The aforementioned materials are good thermal conductors and thus enhance the removal of heat from the motor housing 23 and the components therein. Specifically, the materials have a thermal conductivity of greater than about one (1) W/m-K and preferably greater than 20 W/m-K.

Figure 11:
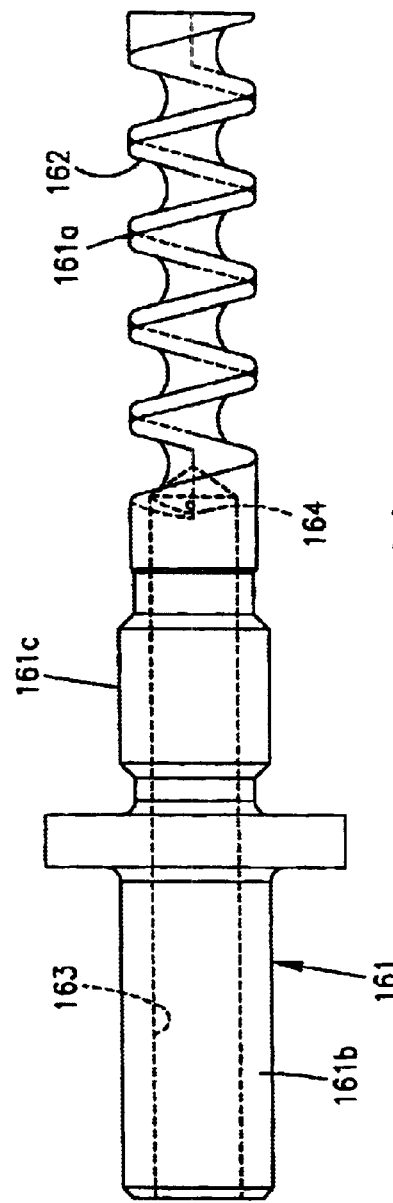
FIG. 11 is a side elevational view of a portion of the ultrasonic transducer of FIG. 1 in one embodiment of the present invention.

The central helical portion 141c extends through the central bore 47 of the drive rod 42. Means for forming the central helical portion 141c includes an elongate member in the form of a cooling tube 161. The inner cylindrical surface 48 of the drive rod 42 also serves to form the central helical portion 141c of the fluid passageway 141. The cooling tube 161 is made from any suitable nonelectrically conducting material such as a polyamide/imide, for example Torlon®, and has a first end portion or a helical portion 161 a and an opposite second end portion in the form of a fitting 161b (see FIG. 11). A central or threaded portion 161c is disposed between the helical potion 161a and the fitting 161b. The helical portion 161a is sized and shaped for disposition within the central bore 47, as shown in FIG. 3. In one embodiment, the helical portion 161a has a longitudinal dimension or length of approximately 1.9 cm (about 0.75 in) and an outer diameter of approximately 0.53 cm (about 0.21 in). In one embodiment, a helical channel 162 having at least four turns extends circumferentially around helical portion 161a. In one embodiment, the helical channel 162 has a radius of approximately 0.15 cm (about 0.06 in). The cylindrical central portion 161c of the cooling tube 161 is externally sized and shaped to threadably engage threaded bore 131 of preload plate 128 to secure helical portion 161 a within drive rod 42. A central bore 163 extends longitudinally through the fitting 161b and the central portion 161c to an opening 164 in the helical channel 162 (see FIG. 11). The bore 163 extends through the open end of the fitting 161b.

The cooling fluid is introduced into the ultrasonic transducer 21 by means of a tubular inlet fitting 171 having a bore 172 extending therethrough (see FIGS. 1–4). An inlet line (not shown) is connected to the inlet fitting 171 in this regard. The inlet fitting 171 is threadably secured to an inlet bore 173 extending longitudinally through the cylindrical wall 26 of the motor housing 23 (see FIGS. 3 and 5). The longitudinal inlet bore 173 communicates by means of an opening 176 in the flange face 101 with a radially-extending bore 177 entering the side of the flange portion 97 of the wave-guide 96. The radial bore 177 extends approximately to the center of the flange portion 97. A plug 178 serves to close the opening of the radial bore 177 in the outer cylindrical surface of flange portion 97. First, second, and third openings 181, 182, and 183 further extend through the flange face 101 for communicating with the transverse bore 177 (see FIGS. 3 and 4). The first opening 181 is radially positioned on flange face 101 so as to permit fluid within the radial bore 177 to communicate with the outer helical portion 141a of the fluid passageway 141. The second and third openings 182 and 183 are similarly positioned to permit cooling fluid to access the middle and central helical portions 141b and 141c of the fluid passageway. The cutouts 91 facilitate the flow of the cooling fluid past the first and second magnetic rings 88 and 89.

The cooling fluid flowing through the outer end middle helical portions 141a and 141b of the fluid passageway 141 recombines in the internal chamber 28 at the other longitudinal ends of the outer and inner cooling fixtures 142 and 156. The fluid within the outer cooling fixture 142 exits the outer helical portion 141a by means of the cutouts 148 in this regard. The cooling fluid from the passageway portions 141a and 141b exits the motor housing 23 through a third bore 63 in the end wall 27. A tubular member in the form of an outlet fitting 186 extends longitudinally from the motor housing 23 and is provided with a bore 187 in communication with the third bore 63. The cooling fluid passageway 141 enters the central bore 163 in the cooling tube 161 through the opening 164 to exit the ultrasonic transducer 21 means of the cooling tube. Exit lines (not shown) are secured to the outlet fitting 196 and fitting 161b of the cooling tube 161 for carrying the cooling fluid away from the ultrasonic transducer 21.

The temperature within the internal chamber 28 can be monitored by means of any suitable temperature sensor (not shown) such as a thermistor disposed in slit 92 in the first magnetic ring 88 atop the drive coil 51. A tubular strain relief 191 is secured to the housing 23 and communicates with the second bore 62 for permitting an electrical wire 192 to enter the motor housing for connection to the temperature sensor.

In operation and use, the transducer 21 uses the drive rod 42 to produce a vibratory motion at the threaded stub 112 of the wave-guide 96. This vibratory motion is in the ultrasonic frequency range, that is at or above 18 kHz. In general, the drive rod 42 is changeable between a first shape in the absence of a magnetic field and a second shape when in the presence of a magnetic field. In one embodiment, the magnetic domains present in the giant magnetostrictive materials of the drive rod 42 align with the longitudinal axis 22 when a magnetic field parallel to the longitudinal axis 22 is applied to the drive rod 42. This alignment of the magnetic domains causes the drive rod 42 to elongate. A sinusoidal input signal is provided to the drive coil 51 for producing a changing electromagnetic field which has the same frequency as the input signal and extends through the drive rod 42.

The Belleville spring 126 serves to create a longitudinal preload on the drive rod 42, which remains constant at approximately 15,600 N throughout the actuation and deactuation of the drive rod 42. The preload externally causes the magnetic domains to be more perfectly oriented perpendicular to the longitudinal axis 22 of the drive rod 42. A much longer linear operation region on the strain versus magnetic field strength curve for the drive rod 42 is thus provided, resulting in a much higher strain for a magnetic field of given strength in comparison to a drive rod having no prestress thereon.

In one embodiment, a tubular magnetic means 71 provides a dc magnetic bias to a drive rod 42 made from a giant magnetostrictive material, which causes the magnetic domains within the drive rod to strain to roughly one-half of their maximum possible value. With the material of the drive rod 42 now at one-half of its total strain, the ac magnetic field from the drive coil 51 adds to and subtracts from the dc magnetic bias field which, through magnetostriction, causes the drive rod 42 to expand and contract from its magnetically biased strain. The magnetic biasing of the drive rod 42 increases the overall efficiency of the magnetostrictive material and decreases the required strength of the input signal to the drive coil 51 (and the resulting heat generated by the drive coil 51) by a factor of two.

The sizing and shaping of the tubular magnetic means 71 provides for a dc magnetic bias in the drive rod 42 which is substantially uniform. As discussed above, the radial thickness of the central bias magnet 74 is smaller than the radial thickness of the first and second bias magnets 72 and 73 disposed on either side of the central bias magnet. This thickness reduction is caused by the relatively larger inner diameter of the central bias magnet 74. The relatively thinner central bias magnet 74 reduces the intensity of the dc magnet bias field at the longitudinal center of the drive rod 42. The uniform dc bias from the tubular magnetic means 71 enhances the performance of the drive rod 42 and the magnetic coupling of the drive rod to the drive coil 51.

The substantially uniform magnetic bias through the drive rod 42 is further facilitated by the use of flux return elements 86–89. As discussed above, the first and second magnetic disks 86 and 87 are disposed on the respective end surfaces 44 and 46 of the drive rod 42. The first and second magnetic rings 88 and 89 are disposed on the respective end surfaces 76 and 77 of the tubular magnetic means 71. These flux return elements serve to capture the dc magnetic field generated by the bias magnets 72–74 and direct the field through the drive rod 42, thereby reducing the magnetic flux leakage in the drive rod 42 and thus enhancing the dc biasing of the drive rod 42.

In one embodiment, the sinusoidal input signal provided by the power source 56 to the ultrasonic transducer 21 has a power of about six (6) kW and a frequency of about 20 kHz. In another embodiment, the power is approximately 35 kW and the frequency is about 20 kHz. The input signal passes through a helically wound wire 52 of the drive coil 51 and causes an alternating electromagnetic field to be generated by the coil through the drive rod 42. In most embodiments, this magnetic field has a maximum field strength ranging from −600 to +600 Oersted. In one embodiment, the maximum field strength is about 500 Oersted. In embodiments using magnetostrictive materials, the magnetic domains in the magnetostrictive material of the drive rod 42 respond to the induced magnetic field by straining, causing the length of the drive rod 42 to elongate and contract in phase with the frequency of the induced magnetic field generated by the drive coil 51.

The ultrasonic transducers of the present invention operate on the principle of conservation of momentum. In the single motor embodiment described above, the wave-guide 96 serves as the momentum reactionary section of the transducer 21. The oscillatory movement of the drive rod 42 causes a corresponding oscillatory force to be exerted by the drive rod 42 against the reaction mass 122. As the drive rod 42 expands, accelerating the reaction mass 122 forward and compressing the spring, the wave-guide 96 reacts to conserve momentum by moving in the opposite direction. Conversely, when the drive rod 42 contracts the reaction mass is accelerated in the opposite direction, the wave guide reacts accordingly. The longitudinal velocity of the transducer 21 at the flange face 101 is approximately zero. The maximum longitudinal velocity of the transducer 21 is at the end surface 107. The wave-guide 96 is in the direct load path of the drive rod 42 and, as discussed above, is longitudinally sized so as to operate at its resonant frequency. Accordingly, a resonant one-half wavelength standing wave is established to cause the threaded stub 112 to oscillate at an ultrasonic frequency in response to the motor assembly 41. The established standing wave is 180° out of phase with the oscillating drive rod 42. The threaded stub 112 can be attached to other systems to produce usable work.

The formation of the wave-guide 96 from the various magnesium alloys set forth above enhances the ultrasonic vibratory motion produced by the wave-guide 96. In general, these magnesium alloys have relatively low density and thus, in accordance with the conservation of momentum principle, increase the velocity of the vibration amplitude output at the threaded stub 112 relative to other acoustic metals such as titanium alloys. The magnesium alloy material of the wave-guide 96 also has relatively high strength which contributes to the life of the transducer 21. In another embodiment, the wave-guide 96 is made from a high speed of sound material, as described below for a master wave-guide (1204) in the high power embodiment.

The flux return elements 86–89 also serve to capture the ac magnetic field created by drive coil 51 and channel that field through drive rod 42 so as to increase the ac magnetic field intensity in the drive rod and thus enhance the performance of the motor assembly 41. The magnetic rings 88 and 89 are positioned at the longitudinal ends of the drive coil 51 and the magnetic disks 86 and 87 are positioned at the longitudinal ends of the drive rod 42 for this purpose. As discussed above, the disks 86 and 87 and rings 88 and 89 are each made from soft magnetic materials which have a low electrical conductivity. These elements are ferromagnetic at ultrasonic frequencies and have very low energy losses. The relatively high electrical resistivity of these elements precludes the creation of appreciable eddy currents therein which reduce the ability of the flux return elements to conduct and direct magnetic flux. Such eddy currents also disrupt the intensity of the alternating magnetic field through the drive rod 42 and thus negatively affect the efficiency of the motor assembly 41. The capturing and redirecting of the ac magnetic field by the flux return elements 86–89 serves to increase the efficiency and the power output of the transducer 21 by a factor of about two to five times.

The active cooling of the motor assembly 41 and tubular magnetic means 71 within the motor assembly 41 by means of fluid passageway 141 further enhances the performance of the transducer 21. The active cooling also permits continuous operation of the ultrasonic transducer 21 at full power. The incorporation of helical passageway portions in and around the drive rod 42, drive coil 51 and bias magnets 72–74, increases the ability of the cooling fluid to carry heat away from the motor assembly 41. In this regard, the utilization of the helical channels 147, 157, and 162 increases the heat transfer area encountered by the cooling fluid. The helical portions 141*a*–*c* increase the fluid flow speed in and around the motor assembly 41 to enhance chaotic flow patterns and turbulence and thus further increase the convection coefficient of the cooling fluid. Specifically, the velocity and convection coefficient of the cooling fluid through the helical portions 141*a*–*c* are increased approximately 10 times and 45 times, respectively.

The construction of the outer and inner cooling fixtures 142 and 156 from an electrically insulating dielectric material further serves to enhance the operating efficiency of the motor assembly 41. Deleterious eddy currents from the high frequency magnetic field generated by the drive coil 51 are not produced in the cooling fixtures 142 and 156. Eddy currents can disrupt the intensity of the ac magnetic field extending through the drive rod 42. Such undesirable eddy currents are also not generated in the nonconductive cooling fluid of the ultrasonic transducer 21. In addition, the fixtures 142 and 156 are good heat conductors and thus enhance the transfer of heat from the various components in the motor section of the ultrasonic transducer 21 to the cooling fluid. The dielectric material of the cooling fixtures 142 and 156 further protects against electrical shorts within the transducer 21.

The transducer 21 can operate at any suitable frequency. In one embodiment, the operating frequency is ultrasonic, such as between about 18 kHz and 100 kHz. In another embodiment, the transducer 21 operates between about 25 kHz and about 40 kHz, such as with a dental tool and other similar devices. In yet another embodiment, frequencies below about 18 kHz are used. Frequencies below about 18 kHz are more likely used for applications such as impact hammers, compaction equipment, and so forth.

Any suitable amount of power can be transmitted from the power source 56 to the motor assembly 41. In one embodiment, less than about ten (10) watts of power is transferred. In a high power embodiment, more than ten (10) watts up to about 10,000 watts of power is transferred. In an alternative embodiment, as described below, the power source 56 is an ultra-high power source providing about ten (10) to 35 kW or more of power. Further, any suitable amount of power can be output from the transducer 21. In one embodiment, about 30 to 70% or more of the power input to the motor assembly 41 is output by the transducer 21. In another embodiment, about 40 to 50% is output. In a specific embodiment, about 13 watts of power is input from the power source 56 to the motor assembly 41 and about 5.8 to six (6) watts, i.e., about 46%, is output by the transducer 21. In another specific embodiment, about 35 kW is input and about 18 kW, i.e., about 60%, is output. In one embodiment, more than 35 kW of power is input to a transducer having one or more drive rods made from a magnetostrictive material, such as TERFENOL-D.

Figure 12:
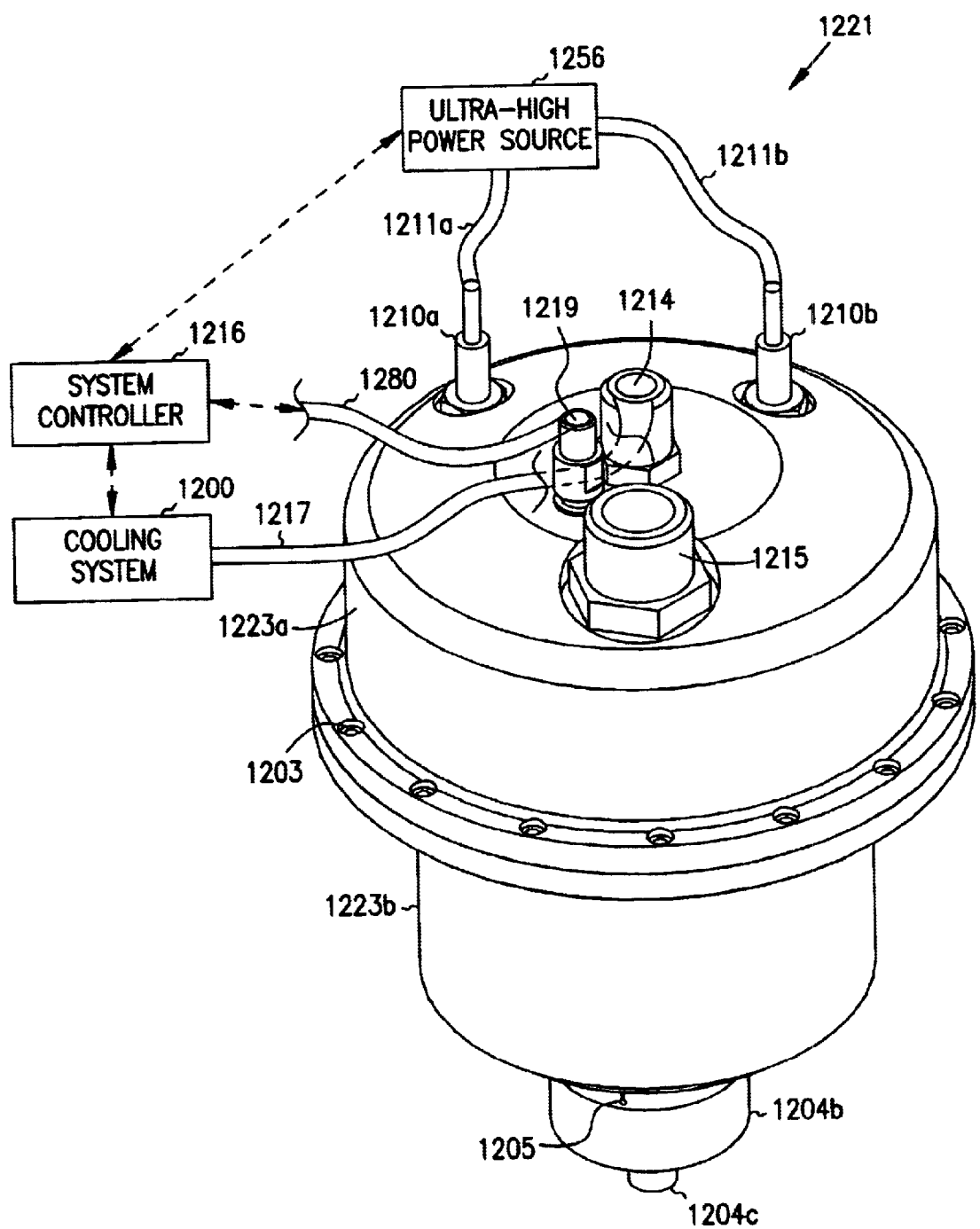
FIG. 12 is an isometric view of an ultra-high power ultrasonic transducer in one embodiment of the present invention.

In another embodiment, the transducer is a multi-component resonant motor configuration, i.e., an ultra-high power transducer 1221. As shown in FIG. 12, the transducer 1221 includes a multi-component housing, i.e., upper housing 1223*a* and lower housing 1223*b*. The lower housing 1223*b* is a retainer housing that encapsulates a mode stabilizer 1204*a* (shown in FIG. 13) and provides radial support to the mode stabilizer 1204*a* and an output amplifier 1204*b*. The two sections of the housing 1223*a* and 1223*b* can be mated together in any suitable manner. In one embodiment, the two sections are bolted together using pre-drilled bolt holes 1203. The multi-component housing can have any suitable geometry and can be made from materials described above for the housing 23 shown in FIG. 4, although the invention is not so limited.

The transducer 1221 is connected to a power source, such as an ultra-high power source 1256, i.e., above about ten (10) kW, via wires 1211*a* and 1211*b* connected to a power connectors 1210*a* and 1210*b*, respectively. The power connectors 1210*a* and 1210*b* are located on the upper housing 1223*a* as shown in FIG. 12. In one embodiment, the transducer 1221 is grounded. The transducer 1221 is also connected to a cooling system 1200 (described in FIGS. 19–21 below) via a hose 1217 connected to a fluid inlet port 1214. An exhaust port 1215 is used to vent coolant gases. As in the previous embodiment, temperature within the transducer 1221 can be monitored by any suitable means. In the embodiment shown in FIG. 12, a temperature sensor 1219 is connected to a thermistor (not shown) and to a sensor wire 1280 that is connected to a monitor (not shown). The transducer 1221 can further be connected to a system controller 1216 for monitoring and controlling various aspects of the operation. In one embodiment, the sensor wire 1280 is also connected to the system controller 1216.

The output amplifier 1204*b* protrudes through the lower housing 1223*b* and has a mounting post 1204*c* on the exposed end, as shown in FIG. 12. Various work pieces can be connected to the mounting post 1204*c* to perform work.

The output amplifier 1204*b* further has slits 1205 for controlling transverse vibrations.

Figure 13:
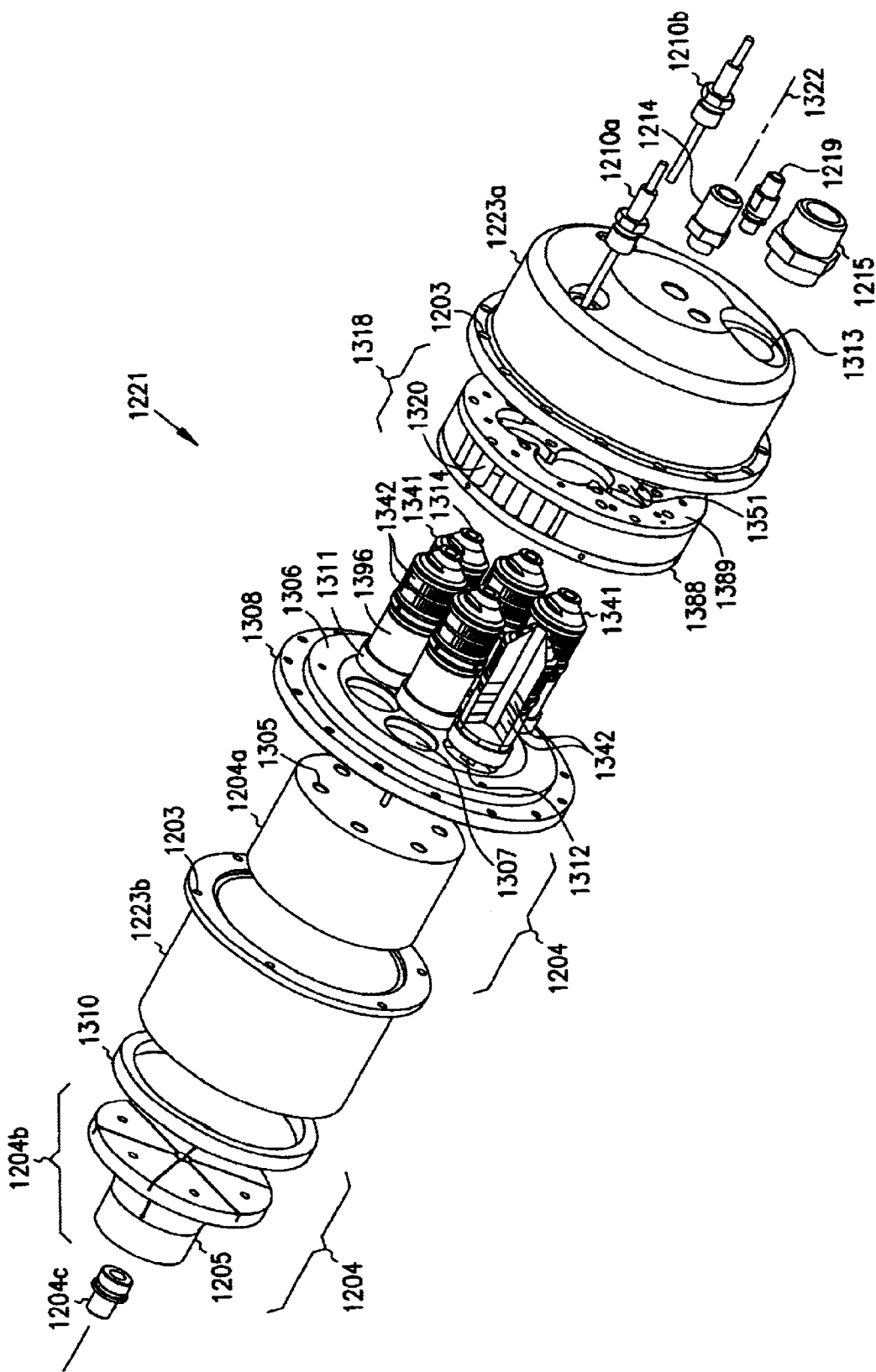
FIG. 13 is an exploded view of the ultra-high powerultrasonic transducer of FIG. 12 in one embodiment of the present invention.

As FIG. 13 shows, the transducer 1221 is comprised of a master wave-guide 1204, a seal plate 1306, a mounting plate 1308, an isolator ring 1310 and the multi-unit housing 1223*a* and 1223*b*, all centered on longitudinal axis 1322. The transducer 1221 is further comprised of multiple sub-motors 1341 as well as a magnetic assembly 1318 comprised of first and second magnetic rings 1388 and 1389 and a plurality of magnetic return pieces 1320. A drive coil or mater coil 1351 is also contained between the rings 1388 and 1389. Additional components can include any type of sensors known in the art, such as an eddy current sensor 1315 located on the master wave-guide 1204 (mode stabilizer 1204*a*).

The sub-motors 1341 each contain an active drive element comprised of one or more drive rods or a split drive rod 1342 (as shown in FIG. 13), a wave-guide 1396, a sub-motor threaded bore 1312, and a preload bolt 1314. The wave-guide 1396 of each sub-motor 1202 is connected to and operates simultaneously with the single resonant wave-guide, i.e., the master wave-guide 1204. The master wave-guide 1204 is comprised of the mode stabilizer 1204*a*, output amplifier 1204*b* and the mounting post 1204*c* connected together in any suitable manner, such as with bolts. The multi-component transducer configuration is one full wavelength, as compared with the previous embodiment, which is ½ wavelength. As a result, this configuration is suitable for ultra-high power applications in excess of ten (10) kW, although it can also be utilized for applications requiring less than ten (10) kW of input power. In one embodiment, this configuration is used for ultra-high power applications of about 30 kW. In another embodiment, this configuration is used for ultra-high power applications in excess of 30 kW.

The housing 1223*a* and 1223*b* can be made from any suitable material, as in the previous single motor embodiment. In one embodiment the housing 1223*a* and 1223*b* is made from a light weight material, such as an aluminum alloy. The isolator 1310 is a soft, slick ring that is press fit into the lower or retainer housing 1223*b*. The isolator 1310 serves as a connection means between the mode stabilizer 1204*b* and the lower housing 1223*b*, thus avoiding the need for a rigid connection. Essentially, the isolator 1310 rides on top of the mode stabilizer 1204*b*, which allows the mod-estabilizer 1204*a* to move in an axial direction without providing drag. In one embodiment, the isolator 1310 is made from a material having a low coefficient of friction. In a particular embodiment, the isolator 1310 is made from Teflon®.

Both the seal plate 1306 and the mounting plate 1308 serve to "sandwich" various orings (not shown) together to form a tight seal. However, the seal plate 1306 should be made from a material having high electrical conductivity in order to repel stray magnetic flux. In one embodiment, an aluminum alloy or magnesium alloy is used for the seal plate 1306. The mounting plate 1308 can be made from any suitable structural metal, such as an aluminum alloy. The seal plate 1306 further has seal plate openings 1307, each sized to accommodate one sub-motor 1202. Each sub-motor 1341 extends through one seal plate opening 1307 and through the mounting plate 1308. Each sub-motor 1342 can further be surrounded by a relatively "soft" sub-motor isolator ring 1311, i.e., shock absorber, that serves to keep the sub-motor 1342 separated from the mounting plate 1308. The sub-motor isolator ring 1311 is attached to the mounting plate 1308. In this way, vibrations do not reach the mounting plate 1308 from the sub-motor 1342, or are otherwise minimized. In one embodiment, the sub-motor isolator ring 1311 is made from plastic or any type of gasketing material. The sub-motor 1341 is then affixed in any suitable manner to an appropriately-sized opening in the mode stabilizer 1204*a*. In one embodiment, the sub-motor threaded bore 1312 of each sub-motor 1341 is screwed into the mode stabilizer 1204*a* using pre-drilled holes 1305 in the mode stabilizer 1204*a*, as shown in FIG. 13.

The master wave-guide 1204 can be made from any suitable material that has the ability to convert ultrasonic power from the sub-motors 1341 to a single source output. In one embodiment, the entire master wave-guide 1204 is made from a high speed of sound material, i.e., a material in which sound travels over 6000 meters/sec. Such materials include, but are not limited to, aluminum-beryllium alloys, beryllium, aluminum-metal matrix composites, and so forth. High speed of sound materials have the desirable characteristic of minimizing or eliminating transverse vibrations, which can limit power transmission. In one embodiment, the material used in the master wave-guide 1204 also has a low Poisson's ratio, i.e., less than about 0.3 to 0.34. In one embodiment, the master wave-guide 1204 is made from an aluminum-beryllium alloy having a speed of sound in excess of 7000 meters per second and a Poisson's ratio of about 0.2. In a specific embodiment, an aluminum-beryllium alloy known as AlBeMet AM126 ("AlBeMet") manufactured by the Brush Wellman Corporation in Elmore, Ohio is used. AlBeMet has a high speed of sound of about 9500 m/sec and a Poisson's ratio of less than about 0.17. Together, these two properties significantly stabilize the mode shape of the transducer 1221, by reducing transverse vibrations in the transducer 1221, which cause almost-pure axial vibration about the longitudinal axis 1322, resulting in deleterious effects on performance.

However, use of AlBeMet alone is quite costly. In another embodiment, the master wave-guide 1204 is a composite material having two sections, i.e., the mode stabilizer 1204*a* and the output amplifier 1204*b*. In this embodiment, a high speed of sound material, such as AlBeMet, is used only for the mode stabilizer 1204*a*, with the output amplifier 1204*b* being made from another material having sufficient fatigue strength, e.g., in excess of 50 ksi. In one embodiment, the output amplifier 1204*b* is made from the same material as the wave-guide 96 in the previous embodiment. In another embodiment, the output amplifier 1204*b* is made from titanium. The titanium material can be any type of titanium or titanium alloy, such as 6-4 titanium (i.e., about six (6) percent aluminum, four (4) percent vanadium and 90 percent titanium) or 10-2-3 titanium (about ten (10) percent vanadium, two (2) percent iron, three (3) percent aluminum, and about 85 percent titanium). The high fatigue strength of materials such as titanium help to amplify output displacement for substantially "infinite" life operation. In one embodiment, total displacement achieved by the transducer 1221 is at least about 60 $\mu$m, without the use of amplifying horns. In another embodiment, total displacement is in excess of 60 $\mu$m, and may be as high as 100 $\mu$m or more. This is as compared with the single motor embodiment described above, in which total displacement was not more than about 20 $\mu$m.

In designing a suitable master wave-guide 1204, it is important that the acoustic impedance characteristics of the mode stabilizer 1204*a* be close to both that of the drive 1342 and the output amplifier 1204*b*. This is achieved with the use of a high speed of sound metal noted above for the mode stabilizer 1204*a* and a titanium material for the output amplifier 1204*b*. Unlike current wave-guides made from just one type of material that has a speed of sound of around 5000 meters per second and a Poisson's ratio of about 0.3, (e.g., aluminum alloys, titanium, titanium alloys and steel), use of a high speed of sound/low Poissori's ratio material for the novel mode stabilizer 1204a of the present invention prevents a "neck down" effect from occurring. Specifically, if a conventional material were used for the mode stabilizer 1204a, the face of the mode stabilizer 1204a to which the sub-motors 1341 are attached would bow and flex from a concave to a convex shape, i.e., the master wave-guide 1204 would become narrower in the center during operation. This would cause the sub-motors 1341 to vibrate sideways at very high acceleration levels, leading to probable early failure of the transducer 1221. By using a material with an adequately low Poisson's ratio and high speed of sound for the mode stabilizer 1204a, the transverse direction is substantially insensitive to motion occurring in the axial direction. As a result, each sub-motor 1341 moves primarily in one direction, and does not wobble from side to side.

Additionally, use of a high speed material in the mode stabilizer 1204a causes the interface of the output amplifier 1204b to move back and forth in a longitudinal direction during operation. However, as the associated sound wave travels down through the sloped section of the output amplifier 1204b (seen more clearly in FIG. 15), transverse waves may develop in the output amplifier 1204b in embodiments where materials having a high Poisson's ratio and low speeds of sound are used for the output amplifier 1204b, e.g., titanium. In order to minimize the effects of such transverse waves, one or more slits 1205 are cut into the output amplifier 1204b (shown more clearly in FIG. 15). The slits 1205 break up the transverse waves, further optimizing transducer performance.

In order for the master wave-guide 1204 to perform properly, it is necessary to properly size the component parts. Essentially, the configuration of the composite master wave-guide 1204 is designed so that a plane, axial wave is propagated. The specific length of each section of the master wave-guide 1204 is a design detail. However, each part length needs to be sized such that as a whole, the master wave guide 1204 can resonate at the desired frequency. In one embodiment, this is about 20 kHz±2 kHz. In one embodiment, the length of the mode stabilizer 1204a and the output amplifier 1204b are about equal. It is important that the diameter of the mode stabilizer 1204a be at least as great or greater than that of the output amplifier 1204b. Otherwise, transverse vibrations may develop in the output amplifier 1204b in the area extending beyond the diameter of the mode stabilizer 1204b, reducing performance, and possibly leading to transducer failure. In one embodiment, the output amplifier 1204b has a diameter of sufficient size to help constrain both the isolator 1310 and the lower housing 1223b from axial movement.

Any suitable number of sub-motors 1341 can be used in the multi-component configuration. In one embodiment, six (6) sub-motors 1341 are spaced about 60 degrees apart. In the embodiment shown in FIG. 13, the sub-motors 1341 are placed in a ring pattern. There is no need to place a sub-motor 1341 in the center area of the ring, since any sub-motor 1341 placed in this position would be doing very little work. This is because it is the outer sub-motors 1341 that will receive most of the field intensity from the drive coil 1351, thus performing considerable amounts of work. In one embodiment, field intensity is relatively uniform across the radial thickness of the sub-motors 1341 by utilizing flux channeling techniques, i.e., proper placement of the magnetic rings 1388 and 1389 (described below) and magnetic components in the sub-motors 1341.

The drive rods 1342 for all of the sub-motors 1341 can be made from any of the materials described above for the drive rod 42 in the single motor embodiment. In one embodiment, a giant magnetostrictive material, such as TERFENOL-D, is used. The drive rods 1342 are powered by the drive coil 1351 that envelopes the back end of the collection of sub-motors 1341. The drive coil 1351 is located inside the magnetic assembly 1318. The magnetic rings 1388 and 1389 have a zero potential and the drive e coil 1351 may have a voltage potential as high as about seven (7) kW. Therefore, two heat conducting rubber rings 1402 are located on either side of the drive coil 1351 to pull heat away from the drive coil 1351 and prevent dielectric breakdown between the drive coil 1351 and magnetic rings 1388 and 1389.

As noted above and shown more clearly in FIG. 13, the magnetic assembly 1318 is comprised of first and second magnetic rings 1388 and 1389, respectively, and magnetic return pieces 1320 that are located between the rings 1388 and 1389. The first and second magnetic rings 1388 and 1389 can be made from the same material and perform essentially the same function as rings 88 and 89 in the single motor embodiment, although modifications have been made to the shape of the inner perimeter to accommodate multiple motors. The magnetic return pieces 1320 are made from any suitable magnetic material and are bonded together in any suitable way. In one embodiment, the magnetic return pieces 1320 are made from the same material as the rings 1388 and 1389, e.g., iron powder manufactured by ProEngCo or MMG. In the embodiment shown in FIG. 14, the magnetic return pieces 1320 are encapsulated together with an adhesive covering 1404, which has been cut-away in one portion to more clearly show the magnetic return pieces 1320. In this way, the plurality of magnetic return pieces 1320 form essentially one bonded unit. The drive coil 1351 fits inside the two rings 1388 and 1389, although in one embodiment there is sufficient space between the components for cooling. In this embodiment, the outside diameter of the drive coil 1351 is smaller than the inside diameter of the first and second magnetic rings 1388 and 1389, respectively, providing a radial gap that allows fluid to cool the outside diameter of the drive coil 1351.

Figure 15:
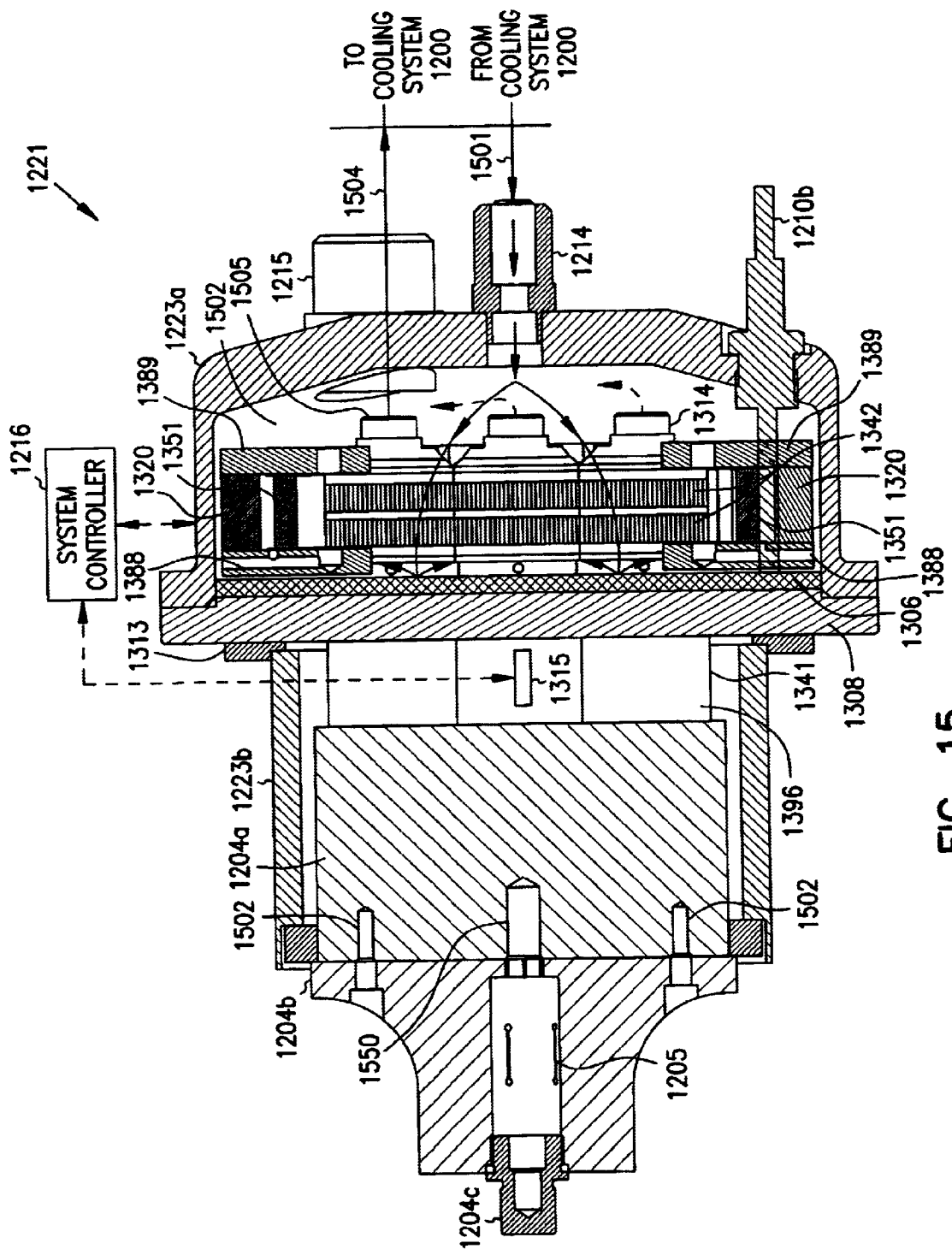
FIG. 15 is a cross-sectional view of the ultra-high power ultrasonic transducer of FIG. 12 in one embodiment of the present invention.

In the single motor embodiment, the majority of the inside diameter of a coil is filled with ferromagnetic material, such as the single rod driven actuator. In the multiple, sub-motor concept, there is not a continuous, solid piece of magnetic material. In one embodiment, more than 40% of the motor is empty space. With the use of ultra-high power motors, such as at or above about 10 kW, it is simpler and more power efficient to provide an electromagnetic field with the single drive coil 1351, as shown in FIGS. 13 15. In this embodiment, the drive coil 1351 is a foil type coil that produces an axial magnetic flux that turns after exiting the coil and passes through the magnetic assembly 1318. Specifically, the drive coil 1351 uses foil windings to create high intensity magnetic fields. Since this configuration has a much higher copper to insulation ratio as compared with a magnet wire or Litz wire, it can also be readily be cooled. In one embodiment, the foil windings have a packing factor of about 85% or higher, i.e., per unit volume of material, the foil winding configuration contains about 85% or more copper. In one embodiment, the dc coil resistance at 22° C. is about 33.5 milli-ohms.

The use of a ferromagnetic return path (comprised of the magnetic assembly1318) is also unique to this embodiment, as the single motor embodiment relied on permanent magnets (72, 73, 74) to create a magnetic field. However, such an arrangement can also be used in this embodiment.

Additionally, use of a single coil is also safer and cheaper as compared with a permanent magnet arrangement. In an alternate embodiment, a magnetic circuit is created using a unique arrangement of permanent magnets. In this embodiment, a central magnet is located in the center of the sub-motor configuration, with six outer edge magnets wedged between the wave-guides of the sub-motors. This configuration creates a fountain flow effect with the polarity of the magnets being opposite that of the end of the drive rod material. In this way, magnetic flux is then distributed among all of the sub-motors uniformly with high intensity.

Figure 14:
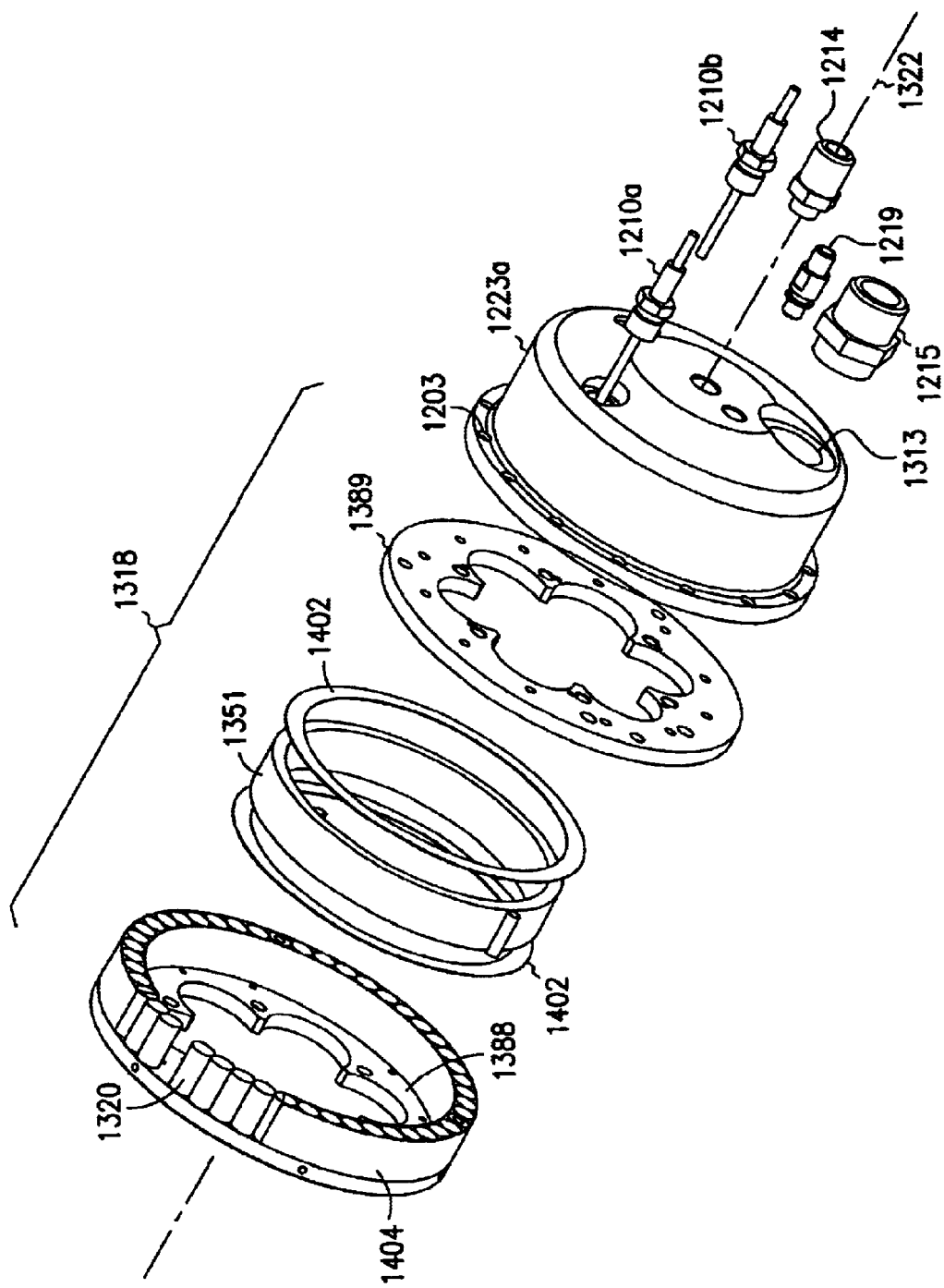
FIG. 14 is a detailed exploded view of a magnetic assembly in the ultra-high power ultrasonic transducer of FIG. 12 in one embodiment of the present invention

FIG. 15 is a cross-section of the ultra-high power transducer 1221 shown in FIG. 14. As can be seen in this view, the two sections of the master wave-guide 1204 can be bolted together using suitable master wave-guide bolts 1502. The mounting post 1204c is affixed to the other sections of the master wave-guide 1204 with a center bolt 1550 that extends from the mounting post 1204c to the mode stabilizer 1204a as shown.

The eddy current displacement sensor 1315 can be placed in any suitable location. This sensor 1315 produces a magnetic field at about one (1) MHz, that generates eddy currents in the surface of the master wave-guide 1204. As the eddy currents increase in the master wave-guide 1204, the displacement being sent to the system controller 1216 increases. Corrective measures can then be taken, such as applying more ac current to the drive coil 1351 to increase the desired output or displacement. Any number of variables can be monitored and controlled with the system controller 1216, including, but not limited to, temperature, pressure, fluid and vapor flow rates, voltage, current, and so forth. In one embodiment, the system controller 1216 locks onto the resonant frequency of the system so that the transducer can operate at its most efficient frequency.

The system controller 1216 may be a local or remote receiver only, or a computer, such as a general purpose computer or a specially-designed Application Specific Integrated Circuit (ASIC)-based controller as is well-known in the art. In one embodiment the system controller 1216 comprises a computer processor, a utility, a driver, an event queue, an application, non volatile memory, input device and monitor. The system controller 1216 is coupled to various sensing devices to monitor certain variables or physical phenomena, process the variables, and output control signals to control devices to take necessary actions when the variable levels exceed or drop below selected or predetermined values. Such amounts are dependent on other variables, and may be varied as desired by using the input device of the controller. The non volatile memory may comprise a disk drive or read only memory device which stores a program to implement the above control and store appropriate values for comparison with the process variables as is well known in the art. In a further embodiment, the system controller 1216 may comprise a state machine coupled to a control panel. Buttons can be provided on the control panel to allow modification of the values and to control the power input, frequency output, and so forth. A system controller 1216 can also be used in the single motor embodiment.

Cooling fluid 1501 flows into the transducer 1221 from the cooling system 1200 through the fluid inlet port 1214 as shown. Once the fluid 1501 hits the seal plate 1306 it splatters radially, flowing into an opening 1501 in each sub-motor 1341. In an alternative embodiment, any number of jets or other devices can be used to direct the flow of the incoming fluid 1501. Any suitable number of openings 1501 can be used. In one embodiment, there are four openings, created by drilling two holes completely through the sub-motor 1341, about ninety degrees apart. The fluid exits through an opening 1505 in the prestress bolt 1314 of each sub-motor 1341 as an exhaust gas/liquid mix 1504, entering into a chamber area 1502 of the transducer 1221. The mix 1504 is vented out through the exhaust port 1215, returning again to the cooling system 1200 to be reliquified and used again as a coolant in the transducer 1221.

Figure 16:
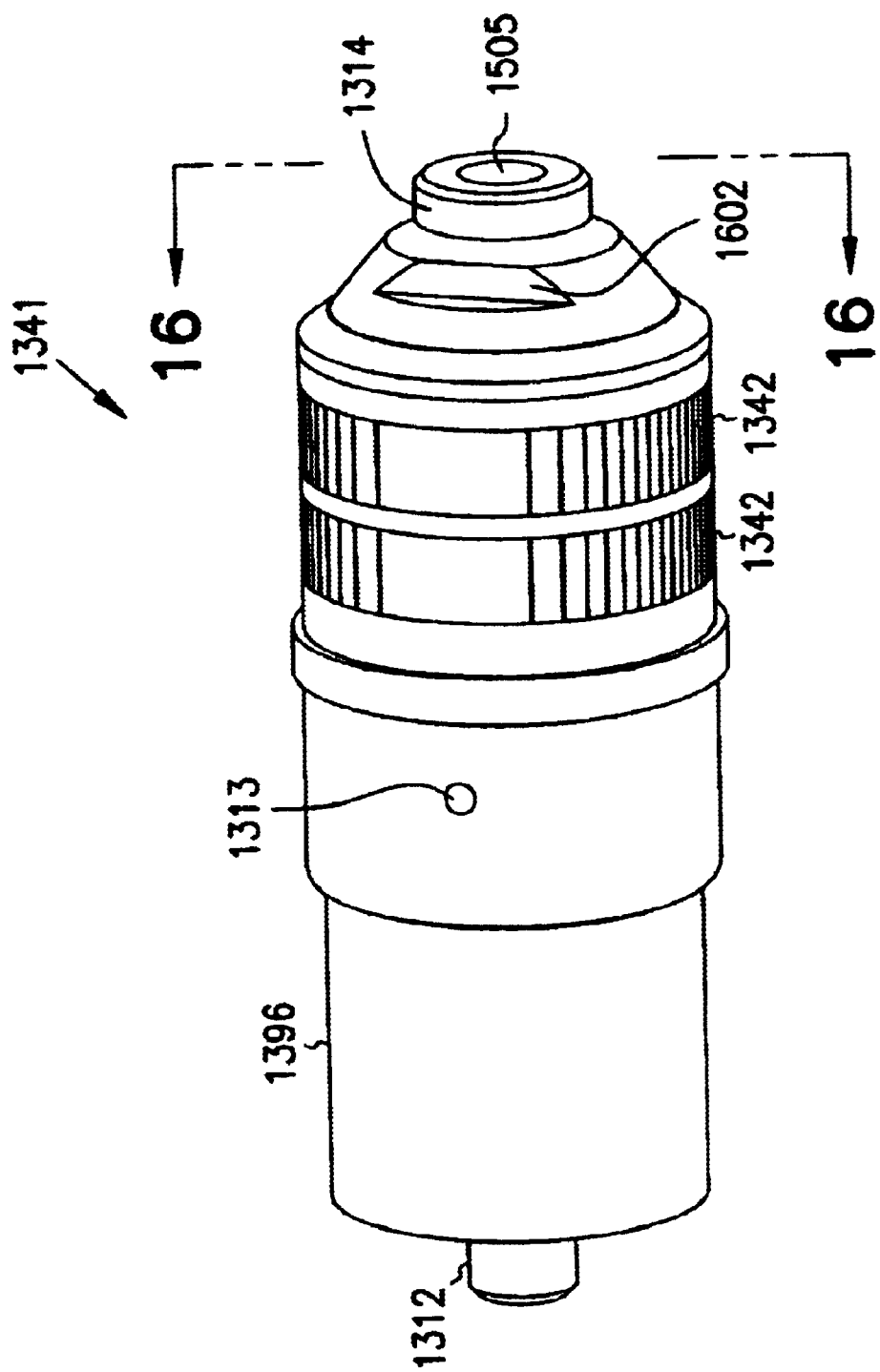
FIG. 16 is an isometric view of a sub-motor in one embodiment of the present invention.

FIG. 16 shows one embodiment of one of the sub-motors 1341 of the present invention. As shown, there is no separate housing for the sub-motor 1341. However, in one embodiment, the sub-motor wave-guide 1396 "necks down" as shown. By removing a portion of the mass of the sub-motor wave-guide 1396 in this manner, the output displacement of the sub-motor wave-guide 1396 is increased. The sub-motor wave-guide 1396 ends with the sub-motor threaded bolt 1312. The prestress bolt 1314 can be seen at the opposite end, with suitable wrench flats 1602 to aid in taking the sub-motor 341 apart, although the invention is not so limited. FIG. 16 also shows one of the fluid inlet ports 1313 noted above.

Figure 17:
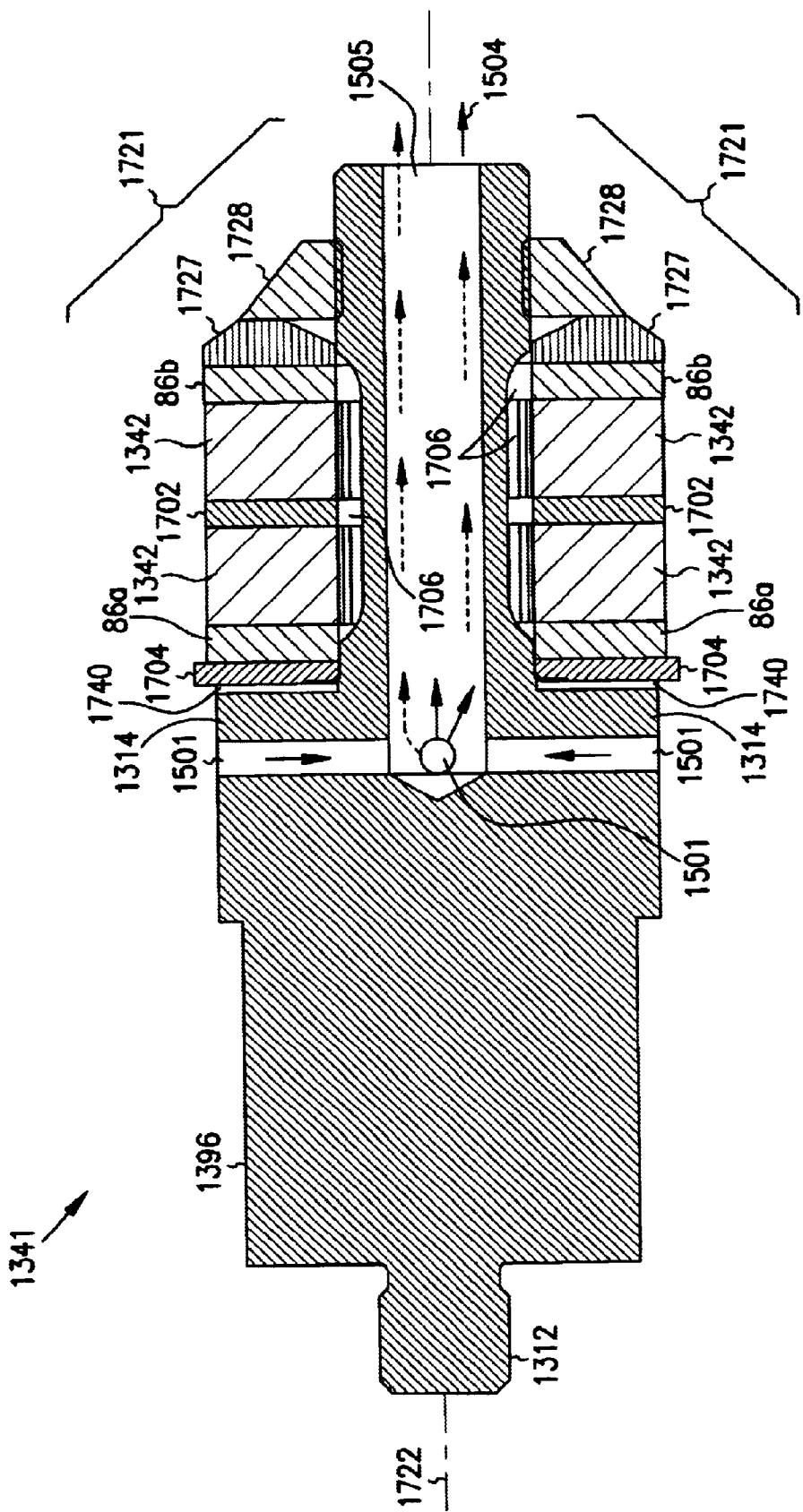
FIG. 17 is a cross-sectional view of the sub-motor of FIG. 16 in one embodiment of the present invention.

As shown in FIG. 17, each sub-motor 1341 is further comprised of two flux intensifying disks (i.e., flux concentrators) 86a and 86b, a mode containment disk 1702, a uniform preload disk 1704, a sub-motor preload disk 1727 and a preload nut 1728. Together, the sub-motor preload disk 1727, preload nut 1728 and one of the flux intensifying disks 86b, comprise a reaction mass 1721. As noted above, the reaction mass 1721 is used for applying a static load to each drive rod 1342. As in the above embodiment, the reaction mass 1721 serves as a means to create momentum from which ultrasonic power is generated. (Essentially, the magnetic assembly 1318, together with the flux concentrators 86a and 86b and drive rods 1342 comprise the magnetic circuit for the transducer 1321).

Unlike the single motor embodiment described above, however, a Belleville spring 126 is not used in this embodiment. Rather, the sub-motor wave-guide 1396 in this embodiment further comprises the prestress bolt 1314 as noted above. In this embodiment, the wave-guide 1396 is a one-quarter wave length wave-guide made from a titanium material, such as the materials used in the wave-guide 96 described previously. The reaction mass 1721, drive rod 1342 and wave-guide 1396 together make up a one-half wave sub-motor 1341. Soderberg fatigue failure criteria indicate that a high strength alloy, such as a near-beta alloy known as 10-2-3 titanium, is suitable for use as the sub-motor wave-guide 1396. Additionally, beta alloys would also likely work. However, most standard grades of standard titanium (i.e. pure titanium, alpha alloys and alpha-beta alloys) may be subject to failure over time under these conditions.

Any suitable size and number of drive rods 1342 can be used in each of the sub-motors 1341, although each drive rod 1342 need not necessarily be the same size. In one embodiment, there is one drive rod 1342 having an outer diameter of about 4.4 cm (about 1.75 in) and an inner diameter of about 1.43 cm (about 0.75 in),which is split lengthwise into two equally-sized rods. In this embodiment, the mode containment disk 1702 is located between the split drive elements to provide radial support, thus reducing any transverse vibratory effects of the drive rods 1342. In this way, transverse vibrations are not able to cause the resonant frequency to drop below the desired frequency, such as about 20 kHz. In one embodiment, the mode containment disk 1302 has about the same dimension as the drive rods 1342, with a thickness of approximately 0.25 cm (about 0.10 in).

The mode containment disk 1302 can be made from any suitable material. In one embodiment, the mode containment disk 1302 is made from a stiff ceramic material. By using a ceramic disk made from aluminum nitride or silicon nitride as the mode containment disk 1302, the internal temperature of each drive rod 1342 is also reduced. Essentially, the high thermal conductivity of the disks 1302 draws heat lengthwise from each of the split elements, thus efficiently transmitting radial heat flow away from the drive rods 1342. In one embodiment, a temperature reduction of at least 30° C. is obtained in each drive rod 1342 with use of the mode containment disk 1302. The mode containment disk 1302 or a device having similar features is very important to the proper operation of an ultra-high power device in excess of ten (10) kW.

In order to ensure that each sub-motor 1341 vibrates efficiently at the desired frequency, such as about 20 kHz, the flux concentrators 86a and 86b are used to guide the magnetic field intensity through rods 1342. The flux concentrators 86a and 86b shown in FIG. 16 enhance the power-generating capability of the drive rod material, such as TERFENOL-D by about four times. Any suitable number of flux concentrators 86a and 86b can be used. In the embodiment shown in FIG. 16, there are two flux concentrators 86a and 86b, one on each side of the split drive rod 1342. The flux concentrators 86a and 86b can be made from any suitable material that can enhance the power-generating capability of the drive rod material. In one embodiment, the flux concentrators 86a and 86b are made from titanium or a titanium alloy. In a particular embodiment, iron powder is used.

In the ultra-high power embodiment, preload is provided by the prestress bolt 1314, rather than a Belleville spring, as noted above. Since a Belleville spring can influence the operational frequency when operating at power levels in excess of six (6) kW, the use of a preload bolt 1314 rather than a Belleville spring also provides for more predictable dynamics. Necessary adjustments can be made to the prestress bolt 1314 to reduce its stiffness, so that it has the necessary softness similar to a Belleville spring. Specifically, bolt stiffness has to be low relative to the drive rod 1342 for good ultrasonic performance, and this can be accomplished by reducing the outer diameter of the prestress bolt 1314. However, larger diameter bolts enclose more time-variant magnetic flux. More time variant magnetic flux creates larger voltage potentials within the bolt. This induces high magnitudes of current flow in the circumferential direction, thus creating heat loss and reducing overall performance of the motor. With a large radial gap 1704, however, bolt stiffness is satisfied along with significantly reducing eddy currents. However, thermal mechanics are still a consideration as discussed below.

It is also important to have an acceptable prestress state within the drive elements, i.e., a uniform preload. In one embodiment, the prestress bolt 1314 is contiguous with the wave-guide 1396, extending from the wave-guide 1396 to the reaction mass 1721. The prestress bolt 1314 serves to place a compressive static load on the drive rods 1342 and to provide stiffness to retract the flux concentrators 86a and 86b during operation. In one embodiment, the prestress bolt 1314 is made from titanium and applies approximately 34,900 N (about 7850 lb$_f$) onto each drive rod 1342. In this embodiment, the prestress bolt 1314 is able to resist essentially an infinite number of vibration cycles. In one embodiment, the prestress bolt 1314 is made from 10-2-3 titanium, has about a 0.97 cm (about 0.38 in) outer diameter and a 0.5 cm (about 0.2 in) inner diameter.

The sub-motor preload disk 1727 performs a function similar to the preload bearing disk 127 in the single motor embodiment, i.e., it provides a mass for the drive rod to push against. However, in the single motor embodiment, the preload bearing disk 127 is non-dynamic. The sub-motor preload disk 1727, however, applies a preload onto the rest of the "stack" in a unique way to provide uniform stress onto the drive rod 1342. (The "stack" includes the flux concentrators 86a and 86b, the split drive rod 1342 and the mode containment disk 1702). In one embodiment, the sub-motor preload disk 1727 is undercut as shown to help make the stress more uniform.

Similarly, the preload nut 1728 performs a function similar to the preload plate 128 described in the single motor embodiment, i.e., both screw down to apply a load. However, in the single motor embodiment, the preload nut 1728 provided load to a Belleville spring. As noted above, in the multi-motor configuration, load is applied directly to the "stack" of components. Additionally, the uniform preload disk 1704 is placed adjacent to the flux concentrator 86a and the prestress bolt 1314. As noted above, there is the slight radial gap 1740 between the uniform preload disk 1704 and the prestress bolt 1314. In this way, the load is applied near the mean radial distance of the inner and outer radii of the drive rod 1341, thus reducing load variation within the rods to acceptable levels.

The prestress bolt 1314 is also a factor in cooling considerations. Specifically, although the outside diameter of the drive rod 1342 has a direct path to the cooling fluid, the inside diameter does not. The heat flux from the inside diameter has to travel from the rod 1342 through a gap 1706 and through the prestress bolt 1314 before being exposed to the cooling influences of the fluid. As shown in FIG. 17, the gap 1706 is the space between the inside diameter of the drive rod 1342 and the prestress bolt 1314. (For clarification, the lamination has been removed from a portion of the drive rod 1342 one side of FIG. 17, to more clearly show that the gap extends lengthwise from the flux concentrator 86a to the sub-motor preload disk 1727). If the gap 1706 is an air gap as small as 0.001 cm (about 0.0005 in) the drive rod 1342, such as a TERFENOL-D driver, can thermally fail. In one embodiment, ceramic powders are added in the gap 1706. Ceramic powders add no measurable amount of mass, but can efficiently remove heat. In one embodiment, boron nitride powder is used. The lubricating properties of boron nitride powder also prevents crack initiation sites from being created.

Figure 18:
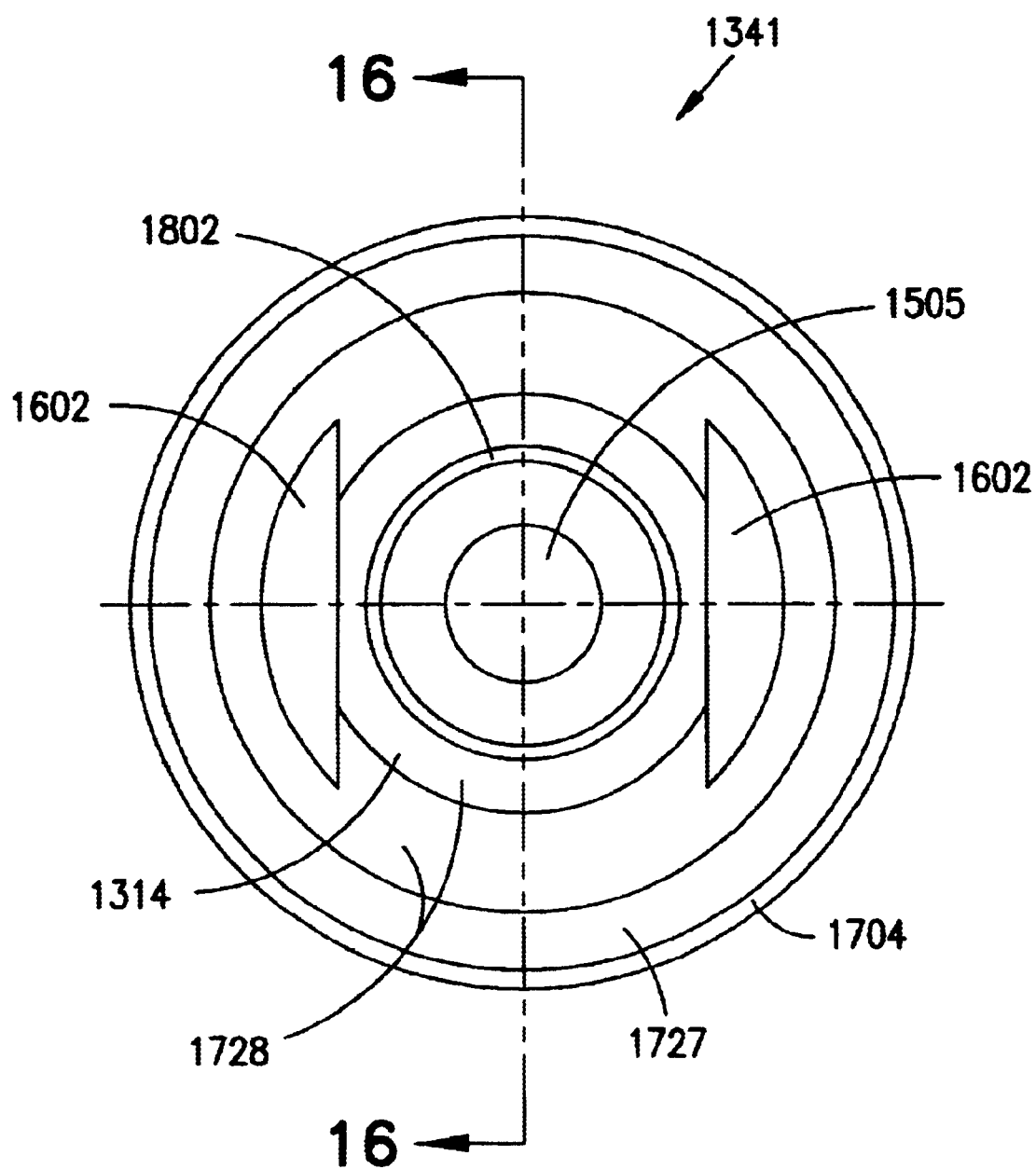
FIG. 18 is an end view of the sub-motor taken along line 16—16 of FIG. 16 in one embodiment of the present invention.

FIG. 18 shows an end view of the sub-motor 1341 taken along line 16—16 of FIG. 16, with the various components described herein. Additionally, a chamfer 1802 is shown between the prestress bolt 1314 and the preload nut 1728.

Those skilled in the art will recognize that the transducers described herein further contain other components not specifically mentioned or described in detail, such as o-rings, gaskets, materials to make bearing surfaces (e.g., leather, cardboard, etc.), and other components known in the art that are necessary for proper operation of a transducer.

As noted above, it is very important to adequately cool the sub-motors 1341 during operation of an ultra-high power transducer, such as the transducer 1321 shown herein. However, in this embodiment, there are no separate cooling fixtures, such as the inner cooling fixture 156, cooling tube 161, fluid passageway 141, outer cooling fixture 142 and ring 143, found in the single motor embodiment. Rather, a hole 1505 is bored through the center of each sub-motor 1341, allowing exhaust gas to exit through the center bolt, i.e., prestress bolt 1314. The elimination of cooling fixtures is also possible in applications where no additional cooling is needed, such as in the dental field, wherein fluid is actively passed through a motor in order to provide irrigation during dental procedures. Cooling is also typically not needed in small motors consuming less than about ten (1) to 20 watts of power.

It is desirable to keep the temperature at the surface of the drive rods 1342 constant, although such "perfect cooling" is not necessarily obtainable in practice. In most applications, thermal gradients will be present throughout the rod and across the boundary layer between the surface of the rod and the cooling fluid. For example, thermal gradients are present throughout a TERFENOL-D rod due to the thermal conductivity of TERFENOL-D. In embodiments in which the TERFENOL-D is laminated, the thermal gradients are even higher due to the glue joints holding the laminate together. If the thermal gradient is too high, the drive rod can fail relatively quickly. However, if the surface can be held to a lower value with the appropriate cooling fluid, the temperature inside the rod will be correspondingly lower. For example, if the cooling fluid is maintained at about 5° C. and the thermal gradient between the surface of the rod and the fluid is about 5° C., the surface of the rod is a minimum of about 100° C.

The use of multiple smaller sub-motors 1341 results in the ability to cool the transducer 1221 in both axial and radial modes of heat transfer. This design also provides for a maintenance of a maximum temperature inside each rod of no greater than about 220° C. Above this temperature, magnetostrictive properties of certain materials, such as TERFENOL-D, begin to drop off. In another embodiment, PZT is used as the drive rod material, and the maximum internal temperature is between about 100° C. to 120° C. In yet another embodiment, nickel is used as the drive rod material. In this embodiment, the maximum internal temperature can be greater than about 220° C. In yet another embodiment, the inside temperature is at about 100° C. or below. Thermal gradients between radial surfaces can also be controlled to acceptable levels with this design, such as to less than about 100° C. In one embodiment, the drive rods 1342 are made with TERFENOL-D, the inner temperature of each drive rod 1342 is maintained between about 80° C. and 0° C., and the skin temperature of each drive rod is maintained at about 20 C.

In order for high power ultrasonic transducers (>about 3 kW), and, in particular, ultra-high power ultrasonic transducers, to run continuously, special cooling methods, such as phase change cooling, is needed for removal of the intense heat from the active drive rods. A phase change cooling system uses the latent heat of vaporization as a means of heat transfer. Latent heat of vaporization is the amount of heat required to change from a liquid state to a vapor state of a cooling medium. Although any number of cooling fluids can be used, in most applications, it is not practical to use large quantities of consumable coolant. Furthermore, due to the excessively high heat flux emitting from the drive element, i.e., in excess of one (1) $MW/m^2$, particularly when operating at power levels in excess of six (6) kW, the choice of coolants is limited. (Typically, heat fluxes around 0.1 $MW/m^2$ are considered to be high). Phase change fluids are non-conductive and do not pose either an electrical isolation hazard nor create eddy currents.

One of the important properties to consider in selecting a coolant is the coolant's critical heat flux. The critical heat flux is a point on the boiling curve where the coolant removes the most heat from a surface. If the heat from the surface becomes greater than the critical heat flux, the temperature difference between the boil temperature and the surface temperature increases dramatically. In the design of high power and ultra-high power ultrasonic transducers, the critical heat flux of the coolant must not be overcome. Otherwise, the temperature inside of the drive rod material, e.g., magnetostrictive material, will increase by about the same amount of the surface temperature. In one embodiment, the critical heat flux is adjusted and increased by increasing the flow rate of the coolant.

It is also important to determine how vibration affects cooling performance. It is widely known that ultrasonic surfaces become very smooth to the touch during operation, i.e., ultrasonic lubrication. One of the fundamental mechanisms of pool boiling is that the surface has to have sites from which boiling inception can take place. Eliminating surface roughness can reduce or eliminate the cooling potential. As a result, in one embodiment, the drive rod (42 or 1342) has a rough surface finish. Surface roughness of the drive rod material will also increase the critical heat flux of the coolant. In one embodiment, the drive rod material is TERFENOL-D, and the surface roughness is greater than about 250 micro inches. A rough surface finish coupled with use of a phase change liquid allow a cool surface temperature to be maintained even with a high surface heat flux. It is also important to maximize the overall surface area in contact with the cooling fluid.

The pressure/temperature curve of the refrigerant must also be considered when selecting a coolant, to make sure the drive rod material is kept cool enough to operate. For some materials, such as TERFENOL-D, this is dependent on stoichiometry. The cooling system 1200 maintains the pressure of the coolant as it flows through the transducer, while the pressure controls the boil temperature of the coolant. If the boil temperature of the coolant is too high, the material will become too hot, causing a dramatic decrease in performance, as well as damage to the drive rod material itself. If the boil temperature is too cold, the material will again have a decrease in performance.

Phase change fluids suitable for use in the transducers described herein include low temperature boiling point hydrocarbons, i.e., fluids that boil at less than about 4° C. In another embodiment, the cooling fluid has a boiling temperature of between about zero 0° C. and 40° C. However, fluids having a wider range of boiling temperatures can also be used. In one embodiment, the cooling fluid has a boiling temperature of between about −100° C. and 250° C. In yet another embodiment, higher-boiling hydrocarbons (up to about 400° C.) are used, preferably with a system operating at lower pressures, such as in a vacuum. In yet another embodiment, very low-boiling hydrocarbons (down to about −200° C.) are used, preferably with a system operating at higher pressures.

In one embodiment, the phase change fluid is any number of known refrigerants, such as SUVA® 134a(R-134a), made by the DuPont Company in Delaware. R-134a is a common refrigerant used in automotive air conditioners, and has a boiling temperature under pressure of between about five (5)° C. and 20° C. Other known refrigerants which can be used, include, but are not limited to, R-123a, R-124, Genetron MP39 (R-22/152a/124), N-butane (R600), isobutane (R600a), N-pentane (HC-601), isopentane (HC-601 a), ammonia (R-717), carbon dioxide (R-744), RC270, PFC-C318, R-E134, dimethyl ether (DME or RE170), R-E245fal, and so forth. (Freon, i.e., hydrofluorocarbons and hydrofluorochlorocarbons would also provide adequate cooling in the transducer 1321). In an alternative embodiment, water is used as the phase change fluid. Phase change fluids provide sufficient cooling to operate high power ultrasonic motors in excess of three (3) kW continuously. Although liquid metals may also provide sufficient cooling, these fluids are electrically conductive. Furthermore, upon exposure to high intensity, high frequency magnetic fields, liquid metals will likely generate large eddy currents, reducing the overall efficiency of the device.

In theory, if the heat generated by a transducer is one unit, then it follows that the coolant flow rate must also provide one unit of cooling. However, preliminary tests show that the flow rate of the coolant must provide enough cooling for at least about 1.5 times the heat generated by the transducer. This is likely due to a large flow area within the transducer, as compared to the flow area of the coolant line into the transducer. When the coolant enters the transducer, it expands, with some of the area inside the transducer containing liquid coolant, while other locations contain coolant in a gaseous form. In order for the cooling effect to work, the gaseous coolant must not become trapped or remain in one portion of the area for too long, i.e., more than about 0.1 seconds. Increasing the flow rate of the coolant helps to prevent this from occurring.

Figure 19:
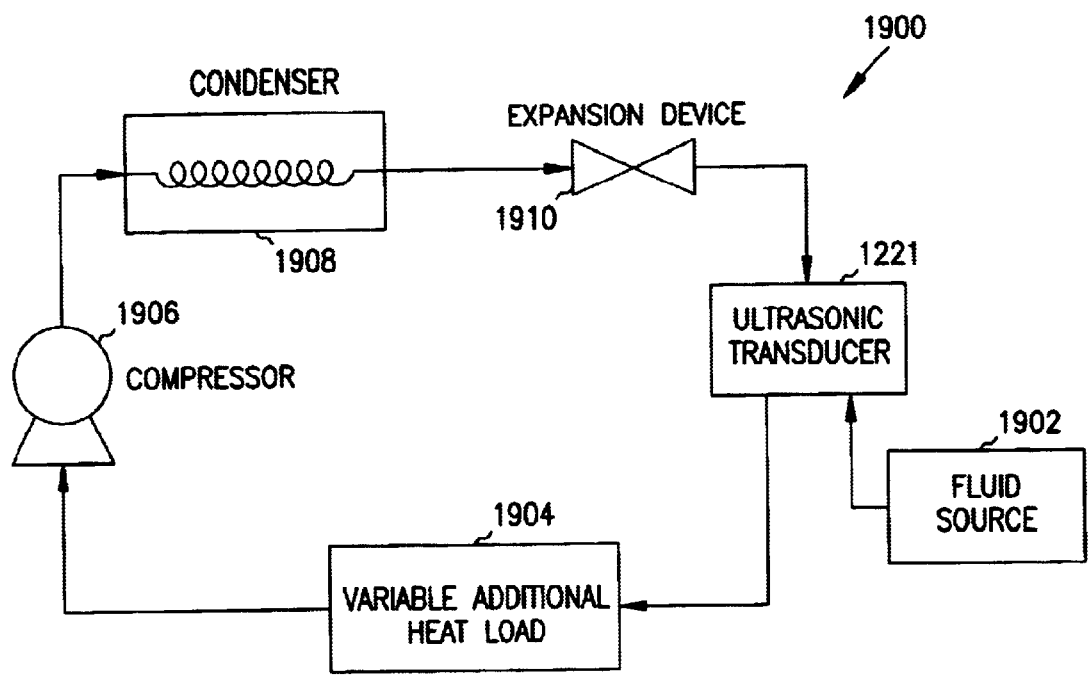
FIG. 19 is a flow diagram of a single loop cooling system with variable additional heat load in one embodiment of the present invention.
Figure 20:
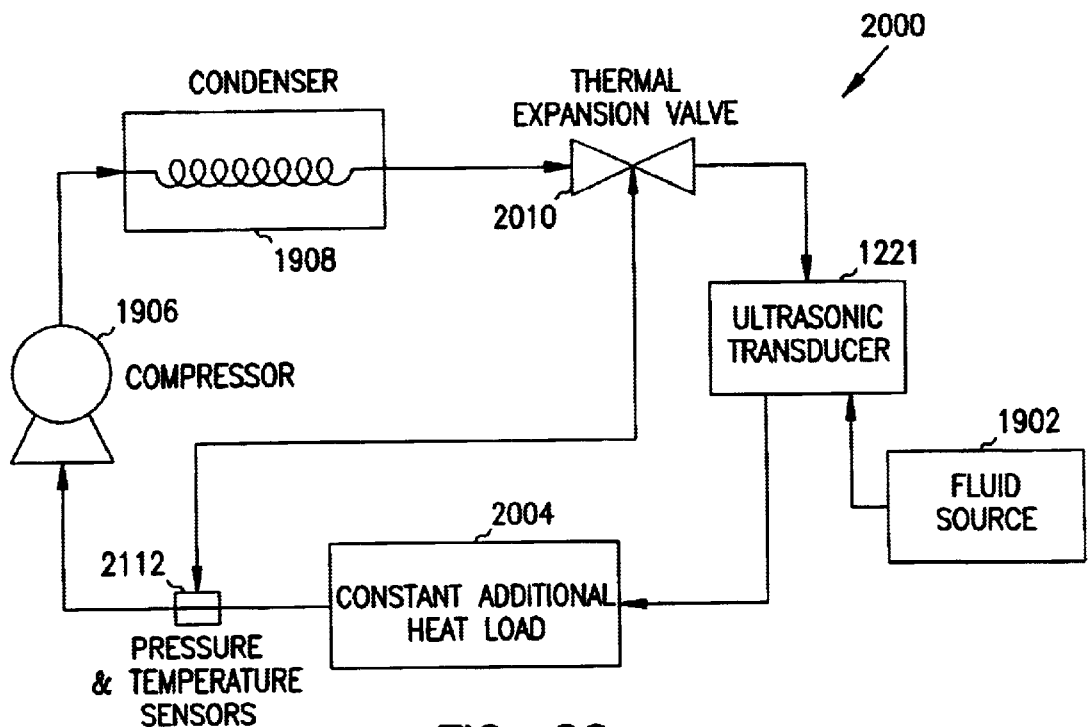
FIG. 20 is a flow diagram of a single loop cooling system with constant additional heat load in one embodiment of the present invention.
Figure 21:
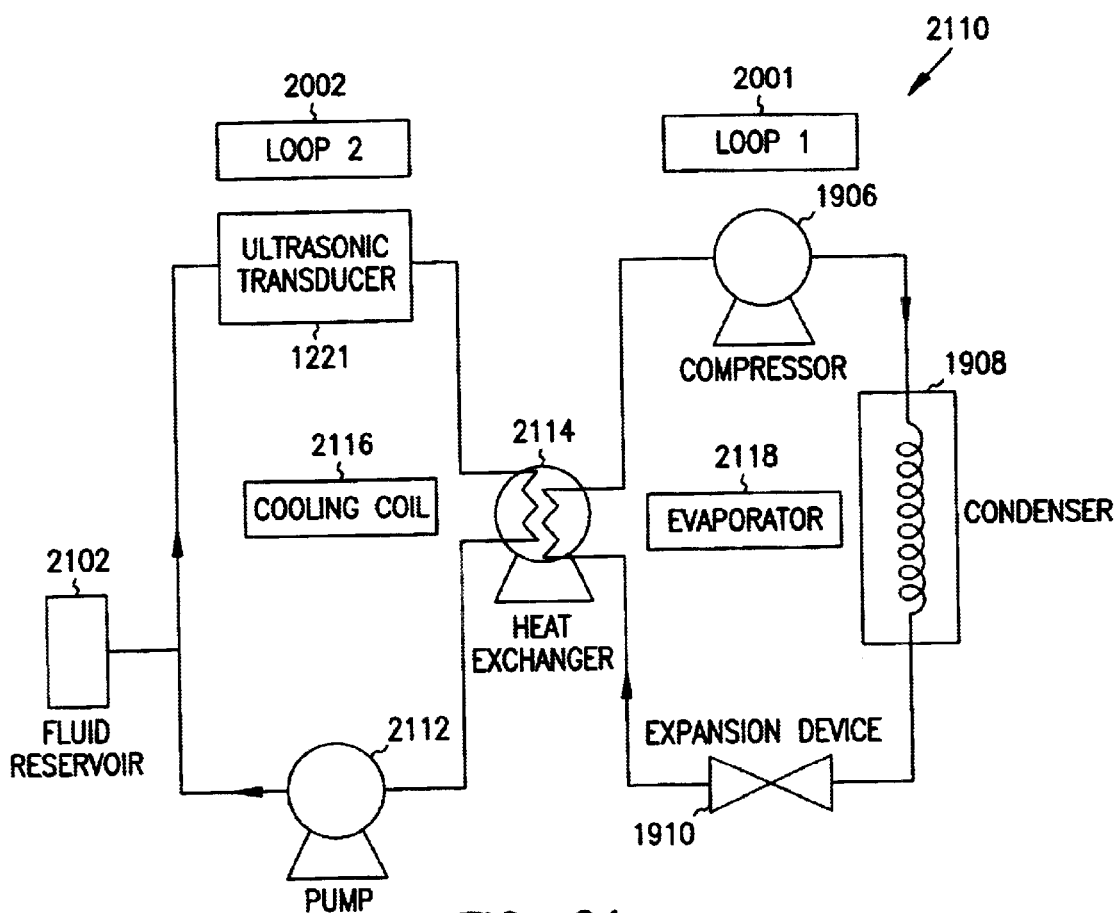
FIG. 21 is a flow diagram of a dual loop cooling system in one embodiment of the present invention.

Use of a phase change fluid cooling system, as shown in FIGS. 19–21, provides for a highly efficient means of energy exchange as compared with conventional methods, such as moving air across a heated surface, or flowing a conventional coolant (a coolant that cannot take advantage of boiling) through a device. In one embodiment, the phase change cooling system is comprised of a single loop or dual loop refrigeration, air conditioning or a "chiller" system, although the invention is not so limited. (A "chiller" system is generally considered to be a refrigeration system that is colder than a conventional refrigeration system). The phase change cooling system can use any number of phase change mediums, as described above. The single loop system is a direct system in which the cooling medium is in direct contact with the energy generation elements of the transducer, i.e., the drive rods (42 or 1342). The single loop system can include variable additional heat load or constant additional heat load. The additional heat load ensures that the flow rate, i.e., cooling effect, of the cooling medium, is greater than the heat load of the high power or ultra-high power ultrasonic transducer. The dual loop system uses a heat exchanger to transfer energy from the cooling medium to a second closed loop cooling system.

Due to the variable heat load nature of a high power ultrasonic transducer, an additional heat load (constant or variable) must be applied to the cooling system. This additional load may consist of an evaporator, hot gas bypass system, or any other method for applying an additional heat load to the cooling system (See FIGS. 19–21). If an evaporator is used, the variable heat load may consist of controlling the evaporating fan input current. This increases or decreases the air speed across the evaporator corresponding to an increasing or decreasing heat load. This is advantageous because the total heat load (transducer plus evaporator) remains constant. A constant heat load always ensures a superheated vapor at the compressor suction line and allows the cooling system to operate as if it were under normal conditions. The evaporator fan speed may be controlled by either a variable head pressure controller or any other device used to vary the current to the fan.

In one embodiment, the additional heat load is a variable load in order that the total heat load (transducer plus additional heat load) remains constant. This total heat load allows for a constant heat load on the cooling system, allowing for no additional control of the cooling medium flow. FIG. 19 shows one embodiment of a single loop (or closed) cooling system 1200a with variable additional heat load. Initially, the cooling medium flows from a fluid reservoir 1902 through the transducer 1221. The cooling medium removes heat from the transducer 1221 as it changes state (boils). From the transducer 1221 the flow is directed to the additional heat load 1904 where it again receives heat. The heat load from the additional heat load 1904 varies according to the heat load from the transducer 1221. From the additional heat load 1904, the cooling medium passes through a compressor 1906, where once again it takes on heat. At this state-the cooling medium is a superheated vapor. Next, the cooling medium flows through a condenser 1908 where it gives off heat to the surrounding air. After passing through the condenser 1908, the cooling medium is a sub-cooled liquid. Lastly, the cooling medium experiences a throttling process as it flows through an expansion device, such as an expansion valve 1910, to the transducer 1221 and the process repeats.

In another embodiment, the additional heat load is constant. FIG. 20 shows one embodiment of an alternative single loop cooling system 1200b with constant additional heat load. The process is similar to the process, shown in FIG. 19, except for a constant additional heat load 2004. Due to the variable heat load nature of the transducer 1221, however, the total heat load in the system 1200b (transducer plus additional heat load) varies. In this embodiment, therefore, a thermal expansion valve 2010 is used in place of the expansion device 1910 shown in FIG. 19. The thermal expansion valve 2010 senses the varying heat load and adjusts the flow rate of the fluid accordingly. Additionally, sensors 2112, such as pressure and temperature sensors, are used in the system 1200b.

FIG. 21 shows one embodiment of a dual loop cooling system 1200c. In this embodiment, Loop "1" (2001) is essentially a refrigeration, air conditioning or chiller system as described above in FIGS. 19 and 20. (Although an expansion valve 1910 is shown, in an alternate embodiment, a thermal expansion valve 2010 is used). In this embodiment, however, the cooling medium transfers energy through a heat exchanger to a second closed loop cooling system, i.e., Loop 2 (2002). Loop 2 (2002) provides direct cooling to the energy generation elements of the transducer as described in the above figures. Coolant is drawn from a fluid reservoir 2102. Flow rate is provided by a pump 2112 (or a compressor) as shown. From the transducer 1221, the cooling medium travels through a heat exchanger 2114 where it transfers heat to Loop 1 (2001). The heat exchanger 2114 comprises a cooling coil 2116 and an evaporator 2118. The dual cooling system 2110 has the disadvantage of requiring additional components, thus increasing cost and complexity as compared with a single loop cooling system (1200a or 1200b). However, it has the advantage of involving no fluid to fluid interaction between the two loops. This may provide a benefit to overall system design, as the cooling medium does not need to be compatible with both the transducer and the Loop 1 system. In addition to the components shown in FIG. 21, the dual loop system 2100 may further comprise an accumulator to provide pressure to the cooling medium, i.e., maintain correct boiling temperature of the cooling medium.

It will be understood by those skilled in the art that the various components in the cooling systems can be selected and sized as needed. It will also be understood by those skilled in the art that all of the lines in the cooling systems described above are made from materials which can be either flexible or rigid, depending on their location and use.

Furthermore, all lines are of a suitable diameter for their intended purpose, but are preferably between about 0.64 cm (0.25 in) to about ten (10) cm (four [4] in). in diameter. It will also be appreciated by those skilled in the art that flexible lines can include hoses made from rubber, plastic or other suitable material, and rigid lines can be made from galvanized metal, stainless steel, copper, PVC or other suitable material. In one embodiment, a hose made from a cross-linked polymer is used, such as EPDM and fluoroelastomers.

Also, although not shown, it will be appreciated by those skilled in the art that such means for sensing temperatures, pressures and fluid flow rates, and transducing the same into proportional electrical signals for transmission to readout or control devices may be provided for in all of the principal fluid flow lines. Furthermore, means for sensing temperature, pressure and fluid flow rates in all of the fluid flow lines may also be accomplished by suitable manual means.

Specific fluid dynamic measurements and calculations have not been performed for the various embodiments of the transducer and the associated cooling system itself. These include determining an overall energy balance for each embodiment, measuring flow rates, determining velocity distribution and drag, entrance effects, heat transfer effects, temperatures and pressure of the various components at various stages, and so forth. The precise values of various aspects of this system can be determined, however, by using appropriate measuring devices known in the art, making sequential runs while altering certain variables, and/or performing the appropriate mathematical calculations via computer or otherwise, such as those described in Bennett & Myers, *Momentum, Heat and Mass Transfer,* second edition, McGraw-Hill Book Company, 1974 and Bird, Stewart and Lightfoot, *Transport Phenomena,* John Wiley & Sons, Inc., 1960, both of which are hereby incorporated by reference in their entirety.

However, modal analysis, a well-known method for providing information on the manner in which objects vibrate, and thermal analysis were performed on various embodiments of the ultrasonic transducer. Modal analysis involves determination of the relationship between the velocity and pressure of the system. An "antinode" is a location of zero pressure and maximum velocity. A "node" is a location of maximum pressure or stress and zero velocity. In actual applications, the antinode and node may not be precisely defined, such that there may exist a small amount of pressure at the antinode and some velocity at the node. Thermal analysis involves recording temperatures and temperature gradients in the drive rod during operation.

Modal analysis of a 30 kW motor using the Finite Element Analysis (FEA) package "Ansys 5.4" was conducted to view incremental snap shots of various modes of vibration. When the drive rods 1342 (shown in FIG. 13) were at maximum extension, the output amplifier 1204b for each sub-motor 1341 elongated in a direction opposite that of the drive rods 1342, with a place of zero displacement (node) located at their point of contact. The movement of the sub-motors 1342 caused the mode stabilizer 1204a to react, i.e., compress. As noted above, the entire motion of one cycle of a multi-component 30 kW transducer is a full wave length. Results of this analysis indicate that a 30 kW ultrasonic transducer is operational in terms of fundamental vibration mechanics. Modal analysis of the sub-motors 1342 also indicated that these devices are able to interact appropriately with the master wave-guide 1204. Further refinements as to geometry, shape and specific wave speed of the output amplifier 1204b, as well as the mode stabilizer 1204a, may help to further reduce potential transverse vibration effects which may occur at or near a frequency of 20 kHz.

Additional results of both thermal and modal analysis using a TERFENOL-D rod indicate that the single rod embodiment is best suited for applications of about six (6) kW and below. This is because TERFENOL-D has a low speed of sound, which can cause three dimensional vibration effects in large elements. The thermal conductivity of TERFENOL-D also creates very hot regions within the rod, particularly when it is large, i.e., greater than about 2.5 cm (about one (1) in). To minimize both effects, it is desirable to utilize multiple smaller elements that can resonate at about 20 kHz±2 kHz with few subharmonics interfering with the primary mode of vibration in the rod. As noted above, by using smaller or split elements, the drive rod can be cooled in both the axial and radial modes of heat transfer. Additional modal and thermal analysis can be used to further optimize the system. In another embodiment, a motor capable of operating up to 30 kHz or more is used. Magnetic, mechanical, electrical as well as modal analyses will be performed to maximize device efficiency and ensure compatibility with the selected power generator.

Figure 22:
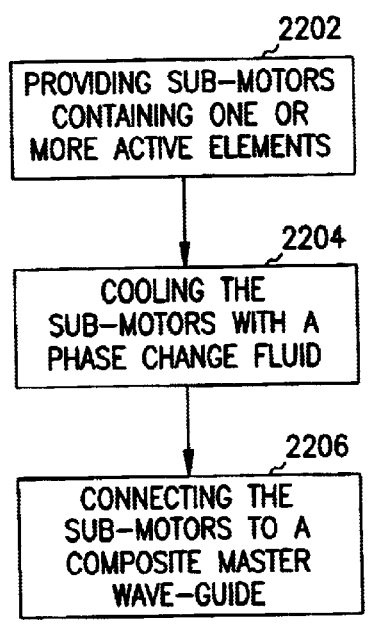
FIG. 22 is a block diagram of a method for providing high power ultrasonic work in one embodiment of the present invention.

A method for channeling ultrasonic energy to perform work is shown in FIG. 22. The method comprises providing 2202 a plurality of sub-motors each containing an active element made from a smart material, wherein the sub-motors operate simultaneously to produce ultrasonic energy. The method further comprises cooling 2204 the sub-motors with a phase change fluid that flows through a single loop cooling system prior to entering the transducer and after exiting the transducer and connecting 2206 the plurality of sub-motors to a composite master wave-guide, the master wave-guide reactive to the ultrasonic energy provided by the sub-motors.

At start-up, the cooling system1200 shown in FIGS. 19–21 is activated. In the single loop systems 1200a and 1200b, this comprises charging the transducer with cooling fluid from a coolant source. Thereafter, the pumps, compressors and other equipment are activated so that coolant flow within the cooling system can begin. In the dual loop system 1200c, pump 2112 is activated to begin drawing cooling fluid from the fluid reservoir 2102 through the transducer 1221. The compressor 1906 is then activated to begin flow of the coolant through the entire cooling system 1200c. The transducer 1221 can then be activated by plugging it into the desired power source to provide up to about 30 kW of power to the transducer 1221.

In operation and use, the ultra-high power ultrasonic transducer 1221 uses multiple drive rods 1342 to produce vibratory motion at the threaded stub 1204c of the master wave guide 1204. The drive rods 1342 all operate simultaneously. The master wave-guide 1204, in the direct load path of the combined drive rods 1342, then reacts with all the combined power of the sub-motors 1341 and transmits ultrasonic power to a load. As noted above, the master wave-guide 1204 is longitudinally sized so as to operate at its resonant frequency. Accordingly, a one-full wavelength standing wave is established to cause the threaded stub 1204c to oscillate at a desired frequency, such as an ultrasonic frequency, in response to the sub-motor assemblies 1341. The threaded stub 1204c can be attached to other systems to produce usable work.

As with the single motor embodiment, each drive rod 1342 is changeable between a first shape in the absence of a magnetic field or a low magnetic field and a second shape when in the presence of a magnetic field or in a higher magnetic field. In one embodiment, the magnetic domains present in each drive rod 1342, such as with the use of giant magnetostrictive materials as the drive rod material, align around the longitudinal axis 1322 when a magnetic field parallel to the longitudinal axis 1322 is applied to the drive rods 1342. This alignment of the magnetic domains causes the drive rods 1342 to elongate. A sinusoidal input signal is provided to the drive coil 1351 for producing a changing electromagnetic field which has the same frequency as the input signal, and extends drive rod 1342. Specifically, passes through the foil in the drive coil 1351 ad causes an a electromagnetic field to be generated by the drive coil 1351 through each drive rod 1342 as discussed herein.

As in the single motor embodiment, the prestress bolt 1314 creates a longitudinal preload externally, causing the magnetic domains to be more perfectly oriented perpendicular to the longitudinal axis of each drive rod 1342. A much longer linear operation region on the strain versus magnetic field strength curve for each drive rod 1342 is thus provided, resulting in a much higher strain for a magnetic field of given strength in comparison to a drive rod having no prestress applied.

In one embodiment, the single drive coil 1351 provides a magnetic flux, i.e., a magnetic bias, to energize the drive rods 1342. In embodiments where the drive rods 1342 are made from a giant magnetostrictive material, this causes the magnetic domains within each drive rod 1342 to strain to roughly one-half of their maximum possible value. With the material of each drive rod 1342 now at about one-half of its total strain, the ac magnetic field from the drive coil 1351 adds to and subtracts from the dc magnetic bias field which, through magnetostriction, causes each drive rod 1342 to expand and contract from its magnetically biased strain.

The sizing and shaping of the ferromagnetic pieces 1320 in the magnetic assembly 1318, as well as the magnetic rings 1388 and 1389, the flux concentrators 86a and 86b, and also including the size of each drive rod 1342 provides for a dc magnetic bias in each drive rod 1342 that is powerful and efficient. Proper sizing also provides a substantially uniform magnetic field. The ferromagnetic pieces 1320 further serve to increase system efficiency overall by reducing system heating. In one embodiment, system heating requirements are reduced by a factor of nearly two with use of up to thirty or more ferromagnetic pieces 1320.

The ultrasonic energy generated by transducers 21 or 1221, can produce usable work in many applications. Scaled-up commercial operations that were previously not economically viable can now be performed efficiently and economically. For the first time, ultrasonic power at 100% duty cycle can be achieved for high power operations, i.e., up to 30 kW or more, essentially allowing for a continuous operation seven days a week, 24 hours a day. For example, ultrasonic transducers can be used for the excitation of solids, fluids, and gases. In the excitation of chemical mixtures, the transducers can cause physical, structural, and chemical changes in the mixture.

As an example, the transducers can be used for the curing of polymers such as industrial epoxy. Polymer curing is essentially the ability to cause a catalytic reaction in polymers by introducing ultrasonic energy. A polymer curing device using the ultrasonic technology of the present invention can travel through a buried sewer or water pipe to repair a pipe by curing its lining, i.e., quick-curing catalysts and thermoset resins. This ability can keep pipes from leaking and also improves the color and taste of water in cast iron or ductile iron pipes. Specifically, rust and lead infiltration from old pipes can now be eliminated at about one-half the cost of excavation and replacement. It is estimated that municipalities in the United States could save in excess of $55 billion over the next 20years by using this type of device.

Another use for this technology is the devulcanization of rubber (tire recycling). It is known that ultrasonic energy applied to long chain molecules can reduce or break key covalent bonds. This capability allows for cracking of certain molecular bonds without high heat requirements, and can be directly applied to recycling rubber and other 3-D cross-link polymers. Research has shown that providing high energy via an ultrasonic transducer is sufficient to break the sulfur bonds, leaving rubber molecules behind. Previous attempts to commercialize this process have failed due to poor scale-up results obtained with conventional ultrasonic devices. With the transducers of the present invention, such as the 30 kW transducer, it is now possible to commercialize this process, thus avoiding the discarding of up to 250 million tires annually. Additionally, new tire processing pollution as well as the associated energy consumption can now be reduced. Other cross-link polymers to which this technology can be applied, include EPDM (roofing, weather stripping, hoses), fluoroelastomer (spark plug boots, ignition wire, swim masks) and silicone (high-temp o-rings and hoses). In addition to the economic benefits of recycling, associated pollution, including the discarding of used devices in landfills, would also be reduced.

Seed sonication could increase food exports by up to $600 million or more annually. Ultrasonic treatment of seeds is known to cause dramatic improvement in plant yield and germination rates. Germination depends in many cases on the uptake of water within the seed and embryo. Benefits directly apply to seed production of vegetables, cereals and flowering plants through reduction in germination time of seeds as well as breaking dormancy in deeply dormant seeds. Clearly, the application of ultrasound can greatly improve food production without increasing tilled acreage. The impact of this capability would allow developing countries to improve their agricultural performance without changing their farming methods. Countries which import food will be able to buy more due to reduced prices, allowing them to better feed their population. Increased germination rates and yield for commercial growers and farmers can reduce their costs considerably.

The transducers of the present invention can also ultrasonically break down heavy molecular chains of oil to reduce viscosity, thus increasing oil production, and inherently increasing the value of the final product. These transducers can also be scaled larger or smaller for use in any number of other applications. For example, a smaller motor could be used for various surgical of other medical tools. Examples include medical tools for dental cleaning, bone prosthesis, insertion and removal, sonic imaging, and surgery. Other applications include using the transducers for disrupting biological cells. The transducers can further be used to degassing soda pop, beer, or wine, and for ultrasonically machining materials or welding components together. Steel processors can use it to improve adhesion and brightness in plating and pickling applications. Food borne pathogens, e.g., e coli, also can be destroyed during cooking using ultrasonics. Pharmaceutical manufacturers can also use ultrasonic energy to begin crystallization and reaction initiation to increase yield and reduce impurities.

In another alternative design of the high power ultrasonic transducers of the present invention, the transducer can be operated in quarter-wave mode wherein one end of the motor section is fixed and the other end of the motor section is free to move. In this design, no wave-guide is needed. In other embodiments, less effective flux concentrating soft magnetic materials such as ferrites or molybdenum Permalloy powder can be used in place of the materials of the high flux return elements described above and be within the scope of the present invention. It should also be appreciated that other embodiments of the ultrasonic transducer herein can include less than all of the components described above and be within the scope of the present invention. In addition, transducers utilizing some or all of the features described above can be provided in applications other than ultrasonics and be within the scope of the present invention. The present invention also includes a method of assembling the various transducers with the unique components described herein.

From the foregoing, it can be seen that a new and improved ultrasonic transducers have been provided. The ultrasonic transducers utilize a smart material actuation element, such as a magnetostrictive material (TERFENOL-D) and has a momentum reactionary section made from a material of relatively low density. Reliable and continuous high power up to about 30 kilowatts can be generated by the transducer. The transducer is relatively compact in size and is easily scalable. Cooling with a phase change fluid can be provided. The actuation element can be magnetically biased with a substantially uniform dc magnetic field. Flux return elements made from a low electrical conductivity material can be utilized. A displacement at the wave-guide tip of approximately 60 micrometers peak-to-peak can be generated.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A high power ultrasonic transducer comprising a housing having a predetermined geometry, means carried by the housing for providing power in excess of three kilowatts including transducer having one or more active elements made from a giant magnetostrictive material and means for producing an electromagnetic field which extends through at least a portion of the one or more active elements, the one or more active elements each changeable between a first shape when in the absence of the electromagnetic field and a second shape when in the presence of the electromagnetic field, biasing means for biasing the one or more active elements, flux path means for capturing magnetic flux through the one or more active elements, means for providing an electrical signal to the means for producing an electromagnetic field, cooling means for cooling the one or more active elements and an acoustic element connected to the transducer for channeling ultrasonic energy to perform work.

2. The ultrasonic transducer of claim 1 wherein there is one cylindrically-shaped active element and wherein the means for producing an electromagnetic field is a coil made from conductive material concentrically disposed about the active element.

3. The ultrasonic transducer of claim 2 wherein the biasing means is a magnetic means.

4. The ultrasonic transducer of claim 3 wherein the magnetic means includes tubular magnetic means concentrically disposed about the cylindrical element, the tubular magnetic means having first and second opposite end portions and a central portion between the first and second end portions, the first and second end portions having a radial thickness and the central portion having a radial thickness which is less than the radial thickness of the end portions for producing a substantially uniform bias over the length of the cylindrical element.

5. The ultrasonic transducer of claim 4 wherein the fast and second end portions having an inner diameter and the central portion has an inner diameter which is less than the inner diameter of the end portions.

6. The ultrasonic transducer of claim 5 wherein the first and second end portions are first and second annular members and wherein the central portion is a third annular member disposed between the first and second annular members.

7. The ultrasonic transducer of claim 2 wherein the cylindrical element has first and second opposite ends, further wherein the flux path means comprises first and second flux return elements carried by the housing, the first and second flux return elements located adjacent to the first and second ends of the cylindrical element.

8. The ultrasonic transducer of claim 7 wherein the first and second flux return elements are first and second disk-like elements made from a material having an electrical resistivity of at least about 0.01 ohm-cm and a magnetic saturation flux density of at least about 8,000 gauss.

9. The ultrasonic transducer of claim 1 wherein the biasing means is a magnetic means.

10. The ultrasonic transducer of claim 1 wherein the acoustic element is mounted on the transducer and is made from a material having a quarter resonant wavelength, the acoustic element having a length equal to the quarter resonant wavelength of the material.

11. The ultrasonic transducer of claim 1 wherein the acoustic element is made from an acoustic metal.

12. The ultrasonic transducer of claim 11 wherein the acoustic element is made from a magnesium alloy.

13. The ultrasonic transducer of claim 1 wherein the cooling means comprises a passageway about the transducer adapted to receive a cooling fluid, the passageway formed from a material which is an electrical insulator.

14. The ultrasonic transducer of claim 13 wherein the material has a thermal conductivity greater than about one (1) W/m-K.

15. The ultrasonic transducer of claim 13 wherein the passageway is formed from hot pressed boron nitride.

16. The ultrasonic transducer of claim 13 wherein the passageway is a helical passageway within the transducer.

17. A high power ultrasonic transducer comprising a housing having a predetermined geometry, means carried by the housing for providing power in excess of three kilowatts, including a transducer having a cylindrical actuation element made from a giant magnetostrictive material and a coil made from electrically conductive wire concentrically disposed about the cylindrical element for producing an electromagnetic field that extends through at least a portion of the cylindrical element, the cylindrical element changeable between a first shape when in the absence of the magnetic field and a second shape when in the presence of the magnetic field, biasing means for biasing the cylindrical element, flux path means for capturing magnetic flux through the cylindrical element, means for providing an electrical signal to the means for producing an electromagnetic field, means for supplying an electrical signal to the coil, cooling means for actively cooling the cylindrical element and an acoustic element connected to the transducer for vibrating at an ultrasonic frequency in response to the transducer for performing work, the transducer capable of performing work on a continuous basis.

18. The ultrasonic transducer of claim 17 wherein the cooling means includes a fluid-carrying passageway which extends about the transducer, wherein the passageway is an electrical insulator.

19. The ultrasonic transducer of claim 18 wherein the fluid-carrying passageway is a helical passageway that extends through the cylindrical element.

20. A high power ultrasonic transducer comprising a housing having a predetermined geometry, a transducer having a rod-like element made from a giant magnetostrictive material and a coil made from electrically conductive wire concentrically disposed about the rod-like element changeable between a first shape when in the absence of the magnetic field and a second shape when in the presence of the magnetic field, tubular magnetic means concentrically disposed about the coil for biasing the rod-like element and having first and second opposite end portions and a central portion between the first and second end portions, the first and second end portions having a radial thickness which is less than the radial thickness of the end portions, means for supplying a sinusoidal electrical signal to the coil, means for actively cooling the transducer which includes an electrical insulator for forming a fluid-carrying passageway which extends about the transducer, the rod-like element having first and second ends, first and second flux return means carried by the housing adjacent the first and second ends of the rod-like element for capturing magnetic flux through the rod-like element and an acoustic element connected to the transducer for vibrating at an ultrasonic frequency in response to the transducer for producing useable work wherein the first and second flux return means are adjacent to the first and second end portions of the tubular magnetic means are made from a material having an electrical resistivity of at least about 0.01 ohm-cm and a magnetic saturation flux density of at least about 8,000 gauss.

21. The ultrasonic transducer of claim 20 wherein the first and second flux return means are adjacent to the first and second end portions of the tubular magnetic means.

22. The ultrasonic transducer of claim 20 wherein the electrical insulator for forming the fluid-carrying passageway is a ceramic material.

23. The ultrasonic transducer of claim 22 wherein the ceramic material is selected from the group consisting of boron nitride, aluminum nitride, alumina, silicon carbide, boron carbide, silicon nitride, pyrolitic boron nitride, beryllia, silicon, and any combination thereof.

24. A high power magnetostictive ultrasonic actuator comprising an active element made from a giant magnetostrictive material having first and second ends, the giant magnetostrictive element changeable from a first shape to a second shape in the presence of a magnetic field, means for producing a magnetic field which extends through at least a portion of the active element and first and second flux return elements adjacent to the first and second ends of the giant magnetostrictive element for capturing magnetic flux produced by said means and directing the magnetic flux through the giant magnetostrictive element, wherein the high power magnetostrictive ultrasonic actuator contains a refrigeration system.

25. An actuator as in claim 24 wherein the means for producing a magnetic field includes a coil concentrically disposed about the giant magnetostrictive element.

26. An actuator as in claim 24 further comprising a permanent magnet concentrically disposed about the giant magnetostrictive element for providing a Dc magnetic bias to the giant magnetostrictive element, the permanent magnet having first and second ends, the first and second flux return elements adjacent the first and second ends of the permanent magnet for capturing magnetic flux produced by the permanent magnet and directing said flux through the giant magnetostrictive element.

27. An ultrasonic transducer comprising:
a plurality of sub-motors, each containing a prestress bolt located proximate to an active element, wherein the sub-motors are designed to operate simultaneously;
a refrigeration system connected to the traducer, the refrigeration system utilizing a phase change cooling medium designed to cool each active element; and
a master wave-guide connected to the plurality of sub-motors, the master wave-guide designed to be reactive to ultrasonic energy produced by the plurality of sub-motors, wherein the master wave-guide channels the ultrasonic energy to perform work on a continuous basis.

28. The ultrasonic transducer of claim 27 wherein the master wave-guide is a composite master wave-guide comprised of a mode stabilizer and an output amplifier, further wherein the mode stabilizer is made from a material having a speed of sound in excess of 6000 meters per second.

29. The ultrasonic transducer of claim 28 wherein the ultrasonic transducer is capable of receiving up to 30 kW of power and outputting frequency in excess of 18 kHz on a continuous basis.

30. The ultrasonic transducer of claim 28 wherein the mode stabilizer and output amplifier each comprise a single one-half wavelength wave-guide, further wherein the transducer can produce a one-fill wavelength standing wave in one complete cycle.

31. The ultrasonic transducer of claim 30 wherein each active element is a one-half wavelength drive rod made from a smart material.

32. The ultrasonic transducer of claim 31 wherein the smart material is selected from the group consisting of piezoelectrics, ferroelectrics, piezoceramics and magnetostrictive materials.

33. The ultrasonic transducer of claim 32 wherein the mode stabilizer is made from aluminum-beryllium, beryllium or a metal matrix alloy and the output amplifier is made from titanium or a titanium alloy.

34. The ultrasonic transducer of claim 27 wherein the refrigeration system comprises a single loop cooling system or a double loop cooling system.

35. The ultrasonic transducer of claim 34 wherein the phase change cooling medium is a low-boiling hydrocarbon, ammonia or water.

36. The ultrasonic transducer of claim 27 further comprising:
a drive coil surrounding the plurality of sub-motors to provide an electromagnetic field; and
a magnetic circuit surrounding the drive coil, the magnetic circuit designed to bias the active elements.

37. The ultrasonic transducer of claim 36 wherein the drive coil has foil windings with a packing factor greater than about 85%.

38. The ultrasonic transducer of claim 36 wherein the magnetic circuit comprises:
each active element;
flux concentrators surrounding each active element;
two magnetic rings surrounding all active elements; and
a plurality of cylindrical magnetic pieces located between the two magnetic rings wherein the magnetic circuit is activated when a dc current is provided.

39. The ultrasonic transducer of claim 38 wherein each active element is comprised of a split active element having two sections.

40. The ultrasonic transducer of claim 39 wherein each sub-motor further comprises:
a mode containment disk located between the two sections of the split active element, the mode containment disk designed to increase cooling of the split active element;
a sub-motor wave-guide contiguous with the prestress bolt;
a gap located between the split active element and the prestress bolt, the gap designed to hold ceramic powder,
one or more sub-motor flux concentrators located next to the split active element;
a preload disk located adjacent to one of the one or more sub-motor flux concentrators; and
a preload nut located adjacent to the preload disk.

41. The ultrasonic transducer of claim 40 wherein the preload nut, one flux concentrator and the preload disk comprise a reaction mass against which the split active element can push.

42. The ultrasonic transducer of claim 40 wherein the ceramic powder in the gap is boron nitride.

43. The ultrasonic transducer of claim 40 wherein the mode containment disk is a ceramic disk.

44. The ultrasonic transducer of claim 40 comprising six sub-motors angled in a ring pattern about a longitudinal axis of the transducer.

45. The ultrasonic transducer of claim 1 wherein the single loop cooling system comprises:
- a heat load source designed to heat the phase change cooling median, wherein the phase change cooling medium is converted from a fluid-vapor mixture to a superheated vapor;
- a compressor located downstream from the heat load source, the compressor designed to keep the superheated vapor under pressure;
- a condenser located adjacent to the compressor, the condenser designed to allow the superheated vapor to release heat to produce a sub-cooled fluid; and
- an expansion device designed to throttle the sub-cooled fluid prior to entering the transducer.

46. The ultrasonic transducer of claim 40 where the wave-guide has a tip, further wherein the wave-guide tip can be displaced about 60 micrometers or more peak-to-peak.

47. The ultrasonic transducer of claim 40 wherein the transducer can be used in sonochemcal processes.

48. The ultrasonic transducer of claim 32 wherein the magnetostrictive material is TERFENOL or TERFENOL-D.

49. The ultrasonic transducer of claim 48 wherein the TERFENOL or TERFENOL-D is laminated.

50. The ultrasonic transducer of claim 45 where the double loop cooling system further comprises a heat exchanger through which the cooling medium can flow to transfer heat.

51. The ultrasonic transducer of claim 45 wherein the heat load source is variable or constant.

52. The ultrasonic transducer of claims 51 wherein the expansion device is an expansion valve or a thermal expansion valve.

53. The ultrasonic transducer of claim 35 wherein the phase change medium is a refrigerant selected from the group consisting of R-134a, R-123a, R-124, R-22/152a/124, R600, R600a, HC-601, RC-601a, R-717, R-744, RC270, PFC-C318, R-E134, dimethyl ether and R-E245fa1.

54. The ultrasonic transducer of claim 45 wherein each prestress bolt has prestress bolt inlet openings through which a cooling medium fluid can enter and prestress bolt outlet openings through which a cooling medium fluid-vapor mixture can exit.

55. The ultrasonic transducer of claim 27 wherein the refrigeration system is a chiller system.

56. A method for channeling ultrasonic energy to perform work comprising:
- providing a transducer having a plurality of sub-motors, each sub-motor containing a prestress bolt located proximate to an active element;
- operating the sub-motors simultaneously;
- flowing a phase change cooling medium through the transducer and through a refrigeration system connected to the transducer; and
- placing a master wave-guide in a direct load path of the plurality of sub-motors, wherein the master wave-guide is reactive to ultrasonic energy provided by the plurality of sub-motors.

57. The method of claim 56 further comprising activating the transducer by providing power to a magnetic circuit surrounding the sub-motors, wherein the ultrasonic energy from the sub-motors is channeled to produce work on a continuous basis.

58. The method of claim 56 further comprising exposing each active element to an electromagnetic field.

59. The method of claim 56 wherein high power work is provided in excess of ten (10) kW.

60. The method of claim 58 wherein the electromagnetic field is provided by a coil made from a conductive material, the coil concentrically disposed about the plurality of sub-motors.

61. The method of claim 60 further comprising providing a dc current to bias the active element.

62. The method of claim 60 wherein two magnetic rings surround the coil, further wherein ferromagnetic pieces are arranged between the two magnetic rings for reducing system heating requirements.

63. The method of claim 56 wherein each active element is a one-half wavelength drive rod made from a smart material.

64. The method of claim 63 wherein the smart material is selected from the group consisting of piezoelectrics, ferroelectrics, piezoceramics and magnetostrictive materials.

65. The method of claim 56 wherein the master wave-guide is a composite master wave-guide comprised of a mode stabilizer and an output amplifier, further wherein the mode stabilizer is made from a material having a speed of sound in excess of 6000 meters per second.

66. The method of claim 56 further comprising:
- splitting the active element into two sections to form a ½ wavelength drive rod;
- guiding magnetic field intensity through the split active element with one or more flux concentrators;
- cooling an inner diameter of each split active element with a silicon nitride or alumina disk; and
- adding ceramic powder to a gap between the prestress bolt and the split active element to increase cooling of the split active element.

67. The method of claim 66 wherein power generating capability of each drive rod is enhanced by about four times with the one or more flux concentrators.

68. The method of claim 66 further comprising:
- allowing the flowing phase change cooling medium to contact a seal plate located in the transducer and splatter radially into prestress bolt intake openings, wherein the cooling medium is a fluid prior to contacting the seal plate and a fluid-vapor mixture after contacting the seal plate;
- venting the fluid-vapor mixture through an exhaust port in the transducer, the mixture first exiting each prestress bolt through prestress bolt outlet openings; and
- in the refrigeration systems heating the fluid-vapor mixture prior to flowing it through a compressor to produce a superheated vapor.

69. The method of claim 63 wherein the magnetostrictive material is TERFENOL or TERFENOL-D.

* * * * *

UNITED STATES PATENT AND TRADEMARK OFFICE
CERTIFICATE OF CORRECTION

PATENT NO. : 6,624,539 B1
DATED : September 23, 2003
INVENTOR(S) : Thomas T. Hansen and Todd A. Reinders It is certified that error appears in the above-identified patent and that said Letters Patent is hereby corrected as shown below:

<u>Title page,</u>
Item [56], References Cited, OTHER PUBLICATIONS, "Magnetostrictive Actuators", reference, delete "(date unknown)" and insert -- (1992 estimated) -- therefor.

<u>Column 4,</u>
Line 10, delete "visa" and insert -- vice -- therefor.
Line 25, delete "." after "acoustic".
Line 30, delete "ultrasonci" and insert -- ultrasonic -- therefor.

<u>Column 7,</u>
Line 9, delete "$Dy_{-xl}$" and insert -- $Dy_{l-xl}$ -- therefor.

<u>Column 10,</u>
Line 64, delete "butting" and insert -- abutting -- therefor.

<u>Column 13,</u>
Line 11, delete "$lb_{f)}$" and insert -- $lb_f$) -- therefor.

<u>Column 20,</u>
Line 63, insert -- rod -- after "drive".
Line 65, delete "metal" and insert -- material -- therefor.

<u>Column 22,</u>
Line 9, delete "e" after "drive".
Line 50, insert -- - -- between "13" and "15".

<u>Column 27,</u>
Line 5, delete "(1)" and insert -- (10) -- therefor.
Lines 21 and 23, delete "5º C" and insert -- 50º C -- therefor.
Line 43, delete "0º C" and insert -- 120º C -- therefor.
Line 44, delete "20 C" and insert -- 20º C -- therefor.

<u>Column 28,</u>
Line 41, delete "4º C" and insert -- 40º C -- therefor.
Line 63, delete "RE170" and insert -- R-E170 -- therefor.

<u>Column 33,</u>
Line 2, insert -- through each -- after "extends".
Line 2, insert -- the input -- after "Specifically,".

UNITED STATES PATENT AND TRADEMARK OFFICE
CERTIFICATE OF CORRECTION

PATENT NO. : 6,624,539 B1
DATED : September 23, 2003
INVENTOR(S) : Thomas T. Hansen and Todd A. Reinders It is certified that error appears in the above-identified patent and that said Letters Patent is hereby corrected as shown below:

Column 33 (cont'd),
Line 3, delete "ad" and insert -- and -- therefor.
Line 3, delete "a" and insert -- alternating -- therefor.

Column 37,
Line 50, delete "traducer" and insert -- transducer -- therefor.

Column 38,
Line 4, delete "one-fill" and insert -- one-full -- therefor.

Column 39,
Line 1, delete "claim 1" and insert -- claim 34 -- therefor.
Line 20, delete "sonochemcal" and insert -- sonochemical -- therefor.
Line 36, delete "RC-601a" and insert -- HC-601a -- therefor.

Signed and Sealed this

Third Day of August, 2004

JON W. DUDAS
*Acting Director of the United States Patent and Trademark Office*